United States Patent
Ogoh

[11] Patent Number: 6,078,079
[45] Date of Patent: *Jun. 20, 2000

[54] SEMICONDUCTOR DEVICE AND METHOD OF MANUFACTURING THE SAME

[75] Inventor: Ikuo Ogoh, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/479,454

[22] Filed: Jun. 7, 1995

Related U.S. Application Data

[63] Continuation-in-part of application No. 08/041,065, Mar. 31, 1993, Pat. No. 5,436,482, which is a continuation of application No. 07/675,593, Mar. 28, 1991, Pat. No. 5,254,866.

[30] Foreign Application Priority Data

| Apr. 3, 1990 | [JP] | Japan | 2-089508 |
| Apr. 25, 1995 | [JP] | Japan | 7-101047 |

[51] Int. Cl.⁷ ................................ H01L 29/76
[52] U.S. Cl. .......................... 257/344; 257/336
[58] Field of Search ............... 257/68, 71, 336, 257/345, 344

[56] References Cited

U.S. PATENT DOCUMENTS

| 4,356,623 | 11/1982 | Hunter | 29/571 |
| 4,404,733 | 9/1983 | Sasaki | 29/571 |
| 4,419,809 | 12/1983 | Riseman et al. | 29/571 |
| 4,636,834 | 1/1987 | Shepard | 257/23.3 |
| 4,760,033 | 7/1988 | Mueller . | |
| 4,935,379 | 6/1990 | Toyoshima . | |
| 4,937,645 | 6/1990 | Ootsuka et al. . | |
| 5,061,975 | 10/1991 | Inuishi et al. . | |
| 5,091,763 | 2/1992 | Sanchez | 257/344 |
| 5,206,183 | 4/1993 | Dennison | 437/47 |
| 5,254,866 | 10/1993 | Ogoh | 257/369 |

FOREIGN PATENT DOCUMENTS

| 0244607 | of 1987 | European Pat. Off. . |
| 0396357 | of 1989 | European Pat. Off. . |
| 61-5571 | 1/1986 | Japan . |
| 63-226055 | 9/1988 | Japan . |
| 63-246865 | 10/1988 | Japan . |

*Primary Examiner*—Sara Crane
*Attorney, Agent, or Firm*—McDermott, Will & Emery

[57] ABSTRACT

Disclosed herein are a structure of and a method of manufacturing a semiconductor device which can relatively readily form a high-concentration impurity layer or a three-layer LDD structure for reducing contact resistance in a source/drain region in high accuracy.

In the method of manufacturing a semiconductor device, deposition of an oxide insulating film and anisotropic etching thereof are carried out a plurality of times, and the anisotropic etching is carried out in a state covering one side wall of a gate electrode part with a mask at least once in the plurality of times thereby forming side wall spacers having different widths on both side walls of the gate electrode part respectively, while the side wall spacer provided on one of the side walls is employed as a mask to form a high-concentration n-type impurity layer to be inside the source/drain region on a semiconductor substrate surface corresponding to this side.

6 Claims, 29 Drawing Sheets

↓ HEAT TREATMENT
900 ~ 950°C , 1Hr n TYPE ION

SEMICONDUCTOR DEVICE AND METHOD OF MANUFACTURING THE SAME

RELATED APPLICATIONS

This application is a continuation-in-part of application Ser. No. 08/041,065 filed on Mar. 31, 1993, (now U.S. Pat. No. 5,436,482) which is a continuation of application Ser. No. 07/675,593 filed Mar. 28, 1991 (now U.S. Pat. No. 5,254,866).

BACKGROUND OF THE INVENTION

1. Field of the Invention

The present invention relates to a semiconductor device and a method of manufacturing the same, and more particularly, it relates to a MOS (metal oxide semiconductor) field effect transistor having an LDD (lightly doped drain) structure and a method of manufacturing the same, for suppressing a hot carrier effect by reducing peak field strength of a drain depletion layer which is caused in a pinch-off state.

2. Description of the Background Art

A MOS field effect transistor is basically formed by providing a metal electrode on an Si substrate with a thin oxide film interposed therebetween for defining the so-called MOS capacitor, and arranging a source for serving as a carrier source and a drain for extracting carriers on both sides of the MOS capacitor. The metal electrode provided on the oxide film, which is adapted to control conductance between the source and the drain, is called a gate electrode. Such a gate electrode is generally prepared from a polysilicon material which is doped with impurity ions, or a metal silicide material which is formed by heat treating a metal having a high melting point, such as tungsten, deposited on a polysilicon material in inert gas.

When the voltage (gate voltage) of the gate electrode is lower than a threshold voltage $V_{th}$ which is necessary for inverting the conductivity type of a portion (channel) close to a surface portion of the Si substrate between the source and the drain, no current flows since the source and the drain are isolated from each other by a p-n junction. When a gate voltage exceeding the threshold voltage $V_{th}$ is applied, the conductivity type of the channel surface is inverted to define a layer of the same conductivity type as the source and the drain in this portion, whereby a current flows across the source and the drain.

If distributions of impurity concentration are abruptly changed in the boundaries between the source, the drain and the channel, levels of field strength are increased in these portions. The carriers attain energy by such electric fields, to cause the so-called hot carriers. Such carriers are injected into the gate insulating film, to define interfacial levels at the interface between the gate insulating film and the semiconductor substrate, or be trapped in the gate insulating film. Thus, the threshold voltage and transconductance of the MOS transistor are deteriorated during the operation. This is the deterioration phenomenon of the MOS transistor caused by the hot carriers. Further, the so-called avalanche resistance against source-to-drain avalanche breakdown is also deteriorated by the hot carriers. The MOS-LDD field effect transistor is adapted to relax the field strength by reducing n-type impurity concentration in the vicinity of the source and the drain and loosening the change of concentration distributions, thereby suppressing deterioration of the MOS transistor caused by hot carriers and improving source-to-drain avalanche resistance.

A conventional MOS-LDD field effect transistor is manufactured by a method shown in FIGS. 1A to 1F, for example. According to this method, a gate insulating film 3 is formed by the so-called LOCOS method on an element forming region of a p-type semiconductor substrate 1 which is enclosed by an element isolation film 2 (FIG. 1A). Then, p-type impurity ions such as boron ions are implanted into the overall surface of the semiconductor substrate 1 for controlling a threshold voltage, to form an ion-implanted region 4 (FIG. 1B). Thereafter a polysilicon film is deposited on the overall surface of the gate insulating film 3 by a low pressure CVD process, to form a gate electrode 5 through photolithography and reactive ion etching (FIG. 1C). In place of the polysilicon film, the gate electrode 5 may be formed by a two-layer film of a metal having a high melting point such as tungsten, molybdenum or titanium, or a silicide thereof, and polysilicon. This gate electrode 5 is doped with phosphorus ions, for example, for improvement in conductivity.

Then, n-type impurity ions such as phosphorus ions or arsenic ions are vertically implanted into the surface of the semiconductor substrate 1 through the gate electrode 5, serving as a mask, to form n-type ion-implanted layers 6 (FIG. 1D). Thereafter an insulating film of silicon dioxide or the like is deposited on the overall surface of the semiconductor substrate 1 by a low pressure or normal pressure CVD process, and anisotropic etching is performed to form side wall spacers 7 (FIG. 1E). Then, n-type impurity ions such as phosphorus ions or arsenic ions are vertically applied to the surface of the semiconductor substrate 1, the gate electrode 5 and the side wall spacers 7, serving as masks, to form n-type implanted layers 8 which are higher in concentration than the ion-implanted layers 6 (FIG. 1F). Thereafter heat treatment is performed for activating the implanted impurity ions, thereby completing the MOS-LDD field effect transistor.

Although a p-type semiconductor substrate is employed in the aforementioned prior art, the substrate may be provided with a p-type well, in which p-type impurity ions are implanted, at least in the vicinity of its surface. Further, the substrate may be formed by an n-type semiconductor substrate, or a substrate provided with an n-type well, in which n-type impurity ions are implanted, at least in the vicinity of its surface. In this case, the gate electrode 5 is of the p-type, and p-type ion-implanted layers 6 and 8 are formed in the source and drain regions.

According to the MOS-LDD field effect transistor obtained by the aforementioned conventional method, the change in distribution of impurity concentration is relaxed in the source and drain regions since the ion-implanted regions 6 of lower concentration are provided on the sides of the source and drain regions adjacent to the channels. Thus, field strength levels are reduced in these portions, to prevent the transistor from the deterioration caused by the hot carriers.

In the conventional MOS-LDD structure, however, the low-concentration impurity diffusion layers (ion-implanted layers 6) of the source and drain regions are diffused laterally toward a portion under the gate electrode 5 upon high-temperature heat treatment in a later step. Thus, parasitic capacitance is added between the gate electrode 5 and the source and drain regions, thereby reducing the operating speed an integrated circuit and hindering refinement of the transistor.

A similar problem is caused in a complementary MOS integrated circuit, for example, which is provided with both n-channel and p-channel field effect transistors, when LDD structures are formed by the aforementioned conventional method. Since diffusion coefficients of impurity elements which are implanted into source and drain regions are varied with types thereof, the optimum width of a side wall spacer for the first conductivity type channel is not necessarily suitable for the region of the second conductivity type channel.

Also in the case of field effect transistors having the same conductivity type of channels, it is impossible to attain optimum widths of side wall spacers required for the respective transistors when concentration profiles of impurity diffusion layers of source and drain regions must be changed in response to performance required therefor.

Japanese Patent Laying-Open No. 61-5571 (1986), 63-226055 (1988) or 63-246865 (1988) discloses a conventional manufacturing method for solving the aforementioned problem. The manufacturing method described in such a gazette is adapted to separately form side wall spacers of n-channel and p-channel MOS transistors, which are provided on the same semiconductor substrate. Namely, when the side wall spacer for the first conductivity type channel is formed, an active region of the second conductivity type channel is covered with a resist film.

A typical example of such a conventional manufacture method is shown in FIGS. 2A through 2H. In this manufacture process, a gate electrode 5 is first formed on respective surfaces of a p-type region and n-type region of a semiconductor substrate 1, which are isolated from each other by an element isolation film 2, with a gate insulating film 3 interposed between the gate electrode 5 and the respective surfaces of the p-type and n-type regions. A silicon nitride film 9a is then deposited on the overall surface of the semiconductor substrate 1 (FIG. 2A). Only the nitride silicon film on the n-type region is thereafter covered with a resist mask (not shown), to remove only the silicon nitride film 9a formed on the p-type region. After the resist mask on the n-type region is removed (FIG. 2B), an insulating film 7a is deposited on the overall surface of the semiconductor substrate 1 (FIG. 2C). Then, the insulating film 7a is subjected to a reactive ion etching, thereby to form side wall spacers 7b and 7c (FIG. 2D). The silicon nitride film 9a formed on the n-type region and the side wall spacer 7c are then removed (FIG. 2E). After that, only the portion on the p-type region is covered with a silicon nitride film 9b. An insulating film 7d is again deposited on the overall surface of the semiconductor substrate 1 (FIG. 2F) with the portion on the p-type region covered with the silicon nitride film 2b. This insulating film 7d is thereafter subjected to the reactive ion etching, so as to form side wall spacers 7e and 7f (FIG. 2G). Then, the silicon nitride film 9b formed on the p-type region and the side wall spacer 7e are removed, so that the side wall spacers 7b and 7f are formed on the p-type region and the n-type region, respectively. According to the technique described in the above gazette, it is possible to make the widths of the side wall spacers for the p-type and n-type channels different from each other at need. However, although the resist film can be formed through a single step for each conductivity type channel region, CVD processors for forming all side wall spacers require long times since only those for the channel region of one conductivity type are formed in a single CVD process. This leads to a problem since the CVD processing time is relatively long as compared with formation of the resist film (FIG. 2H).

SUMMARY OF THE INVENTION

An object of the present invention is to provide a structure of a semiconductor device which enables formation of a high-concentration impurity layer in a self-alignment manner in a MOS field effect transistor having a three-layer LDD structure, or a region of a source/drain region connected with a conductive wiring layer, and a method of manufacturing the same.

A semiconductor device according to the present invention is that having a field effect transistor, and the field effect transistor comprises a semiconductor substrate having a first conductivity type region at least in the vicinity of its surface, a gate electrode which is formed on the semiconductor substrate with a gate insulating film interposed therebetween, a first side wall spacer, which is formed on one side wall surface of the gate electrode, consisting of insulating films of a prescribed number and having a prescribed width, a second side wall spacer, which is formed on another side wall surface of the gate electrode, consisting of insulating films of a number different from that of the insulating films forming the first side wall spacer and having a width different from that of the side wall spacer, a pair of second conductivity type source/drain regions which are formed on the surface of the semiconductor substrate between portions close to those located immediately under both side walls of the gate electrode and outer sides, and a high-concentration second conductivity type layer which is formed on the surface of the semiconductor substrate with an end located in the vicinity of a portion immediately under a side end portion of the second side wall spacer in the semiconductor substrate surface position. The high-concentration second conductivity type layer is higher in second conductivity type impurity concentration than the source/drain regions, and formed inside that of the pair of source/drain regions which is positioned on the second side wall spacer side.

According to this semiconductor device, the second side wall spacer is different in layer number and width from the first side wall spacer while an end of the high-concentration second conductivity type layer is positioned in the vicinity of the portion immediately under the side end portion of the second side wall spacer, whereby the concentration distribution of the source/drain regions and the positional relation of the high-concentration second conductivity type layer with respect to the source/drain regions can be properly controlled by the first and second side wall spacers respectively in the formation process. Thus, it is possible to manufacture a field-effect transistor of a MOS-LDD structure having excellent characteristics with a suppressed leakage current to the semiconductor substrate, in excellent productivity.

This effect particularly remarkably appears as an improvement of a refresh property when the present invention is applied to a memory cell of a DRAM.

In a preferred embodiment, the semiconductor device according to the present invention comprises a conductive layer which is so formed as to cover a surface of the second side wall spacer and to be in contact with the high-concentration second conductivity type layer, in addition to the aforementioned structure.

In this semiconductor device, the distance between a contact portion of the conductive layer and the semiconductor substrate surface and the side end portion of the gate electrode is determined by the width of the second side wall spacer on the semiconductor substrate surface, whereby the position of the contact portion with respect to the gate electrode can be set with high accuracy.

In the semiconductor device according to the present invention, the conductive layer further preferably contains polycrystalline silicon which is doped with a second conductivity type impurity, and the high-concentration second conductivity type layer is formed in a self-alignment manner by thermal diffusion of the second conductivity type impurity from the conductive layer.

In this semiconductor device, the conductive layer contains the polycrystalline silicon which is doped with the second conductivity type impurity and the high-concentration second conductivity type layer is formed in a self-alignment manner by thermal diffusion of the second conductivity type impurity from the conductive layer, whereby the high-concentration second conductivity type layer can be formed in a self-alignment manner through no ion implantation step.

A method of manufacturing a semiconductor device according to the present invention is that of manufacturing a semiconductor device including a field effect transistor in one aspect, and comprises the steps of forming a gate electrode on a major surface of a semiconductor substrate, having a first conductivity type region at least in the vicinity of the major surface, with a gate insulating film interposed therebetween, forming a first side wall spacer and a second side wall spacer which is different in width from the first side wall spacer on both side walls of the gate electrode respectively, implanting a second conductivity type impurity into the surface of the semiconductor substrate through at least the gate electrode serving as a mask for forming a pair of source/drain regions, and introducing a second conductivity type impurity into only the second side wall spacer side of the semiconductor substrate surface through the gate electrode and the second side wall spacer serving as masks for forming a high-concentration second conductivity type layer, with an end located in the vicinity of a portion immediately under a side end portion of the second side wall spacer in the semiconductor substrate surface position, to be inside that of the pair of source/drain regions positioned on the second side wall spacer side. The step of forming the first and second side wall spacers is carried out by performing deposition of an oxide insulating film and anisotropic etching a plurality of times, and the step of performing anisotropic etching a plurality of times is carried out in a state covering either one of the side walls of the gate electrode with a mask at least once, thereby making the first and second side wall spacers different in width from each other.

Through the steps of this method of manufacturing a semiconductor device, the inventive semiconductor device having the aforementioned structure is relatively efficiently formed in high accuracy. Namely, the side wall spacers having different widths are formed on both side walls of the gate electrode not separately but by successively repeating the deposition of the oxide insulating film and the anisotropic etching a plurality of times while covering the position for reducing the side wall spacer width with a mask at need, whereby the side wall spacers in respective stages can be employed as masks for setting different offset values from the end portion of the gate electrode every formation of the individual side wall spacer consisting of a plurality of layers, and it is possible to form a source/drain region of an LDD structure having a prescribed offset value, for forming a high-concentration impurity layer for reducing contact resistance on a semiconductor substrate surface in a connecting portion between a conductive layer which is connected to a surface of the source/drain region and the source/drain region in a self-alignment manner while controlling the offset value from the end portion of the gate electrode in high accuracy, for example.

In another aspect, a method of manufacturing a semiconductor device according to the present invention is that of manufacturing a semiconductor device including a field effect transistor, and comprises the steps of forming a gate electrode on a major surface of a semiconductor substrate, having a first conductivity type region at least in the vicinity of the major surface, with a gate insulating film interposed therebetween, depositing an oxide insulating film on the semiconductor substrate to cover an upper surface and both side wall surfaces of the gate electrode and carrying out anisotropic etching thereon for forming a pair of first side wall spacers on the both side wall surfaces of the gate electrode, depositing another oxide insulating film on the semiconductor substrate to cover the upper surface of the gate electrode and the first side wall spacers and carrying out anisotropic etching only on one of the side walls of the gate electrode for forming a second side wall spacer on that of the first side wall spacers located on the side wall of the gate electrode, implanting a second conductivity type impurity into the semiconductor substrate through only the gate electrode or the gate electrode and the first side wall spacers serving as masks for forming a pair of source/drain regions, and introducing a second conductivity type impurity into the semiconductor substrate surface only on the side wall side of the gate electrode through the gate electrode, the first side wall spacers and the second side wall spacer serving as masks for forming a high-concentration second conductivity type layer which is higher in concentration than the source/drain regions inside that of the pair of source/drain regions located on the side wall side.

This method of manufacturing a semiconductor device preferably further comprises steps of forming a polycrystalline silicon layer which is doped with a second conductivity type impurity on the semiconductor substrate, and patterning the polycrystalline silicon layer for forming a conductive layer which is in contact with a surface of the second side wall spacer and a region to be provided with the high-concentration second conductivity type layer, after the step of forming the pair of source/drain regions. The step of forming the high-concentration second conductivity type layer is carried out by thermal diffusion of the second conductivity type impurity from the polycrystalline silicon layer or the conductive layer caused by performing heat treatment after the step of forming the polycrystalline silicon layer.

Due to application of such manufacturing steps, i.e., the so-called automatic doping, it is possible to relatively readily form a structure comprising a conductive layer serving as a preferred embodiment of the aforementioned semiconductor device according to the present invention in high efficiency.

DESCRIPTION OF THE PREFERRED EMBODIMENTS

With reference to FIGS. 3A to 3J, a first embodiment of the present invention is now described. This embodiment is adapted to manufacture a complementary MOS integrated circuit while employing LDD structures for both n-channel and p-channel MOSFETs.

Figure 1A:
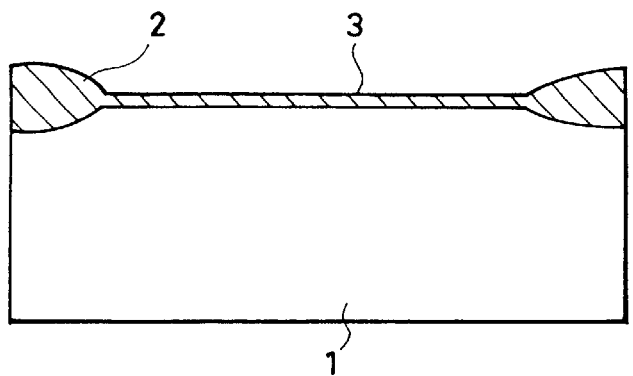
FIGS. 1A, 1B, 1C, 1D, 1E and 1F are sectional views successively showing steps of manufacturing a conventional MOS-LDD transistor.
Figure 1B:
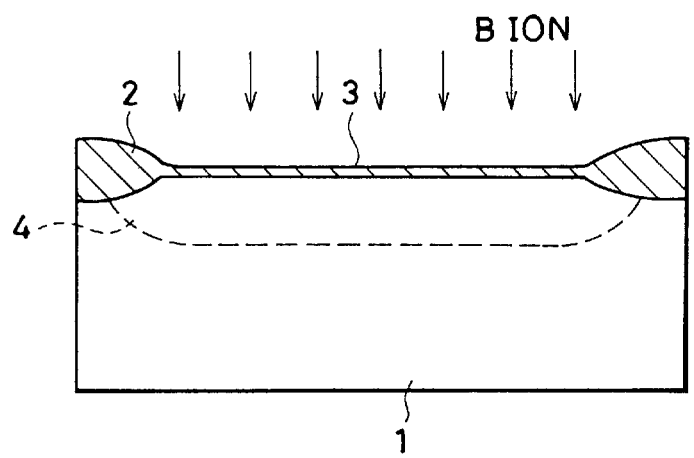
Figure 1C:
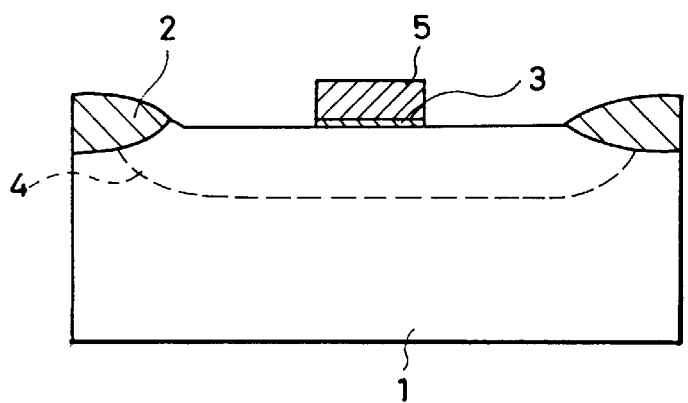
Figure 1D:
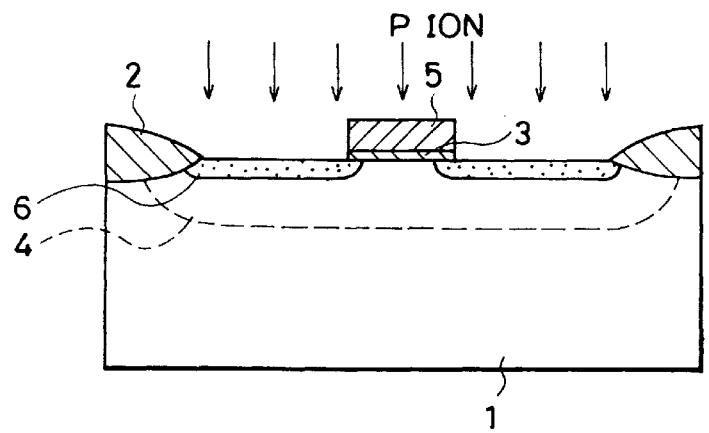
Figure 1E:
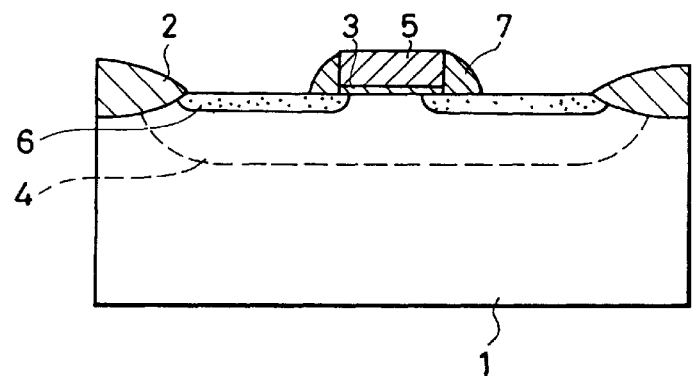
Figure 1F:
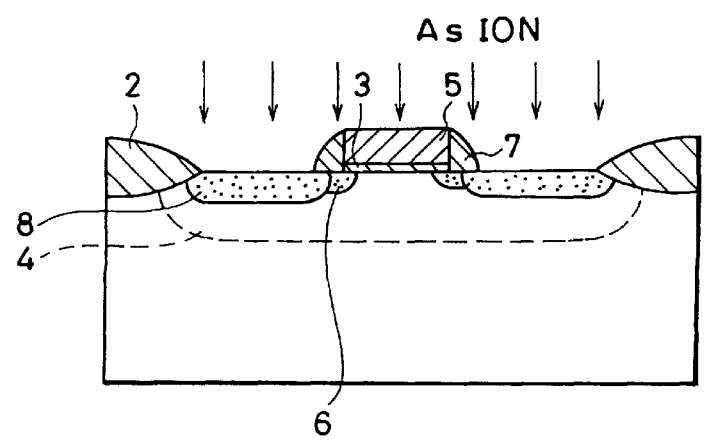
Figure 2A:
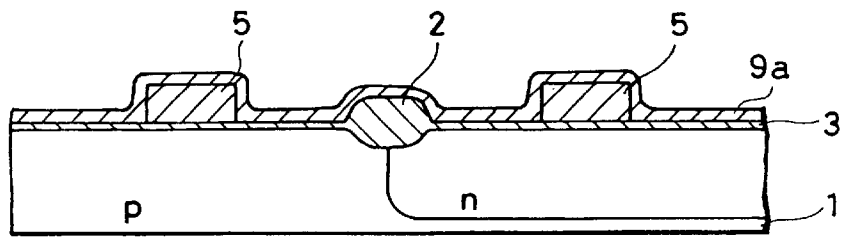
FIGS. 2A, 2B, 2C, 2D, 2E, 2F, 2G and 2H are sectional views successively showing conventional manufacture steps in case where respective side wall spacers of an n-channel MOS transistor and a p-channel MOS transistor are separately formed on the same semiconductor substrate.
Figure 2B:
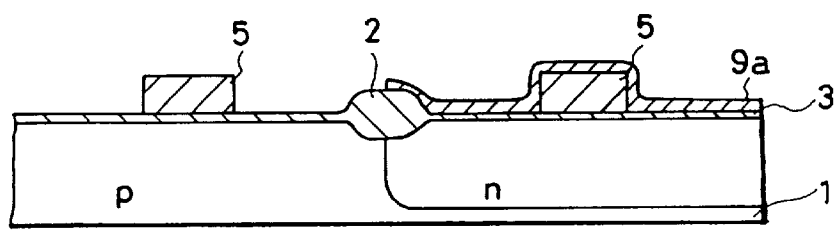
Figure 2C:
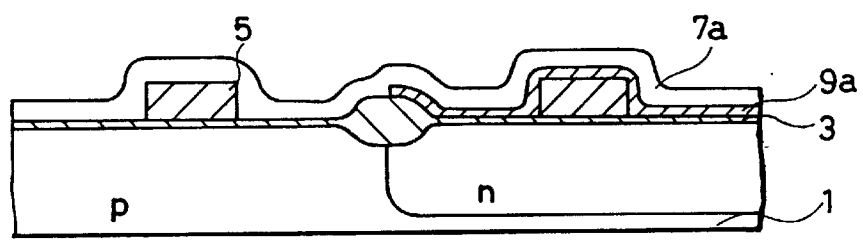
Figure 2D:
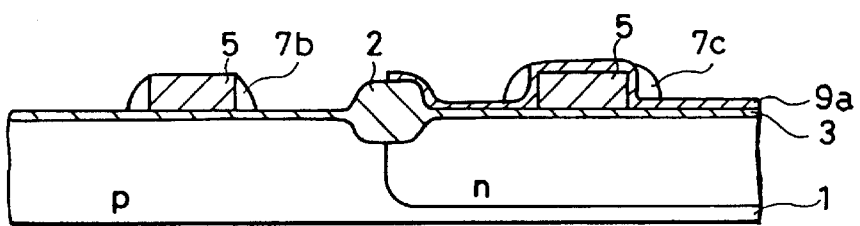
Figure 2E:
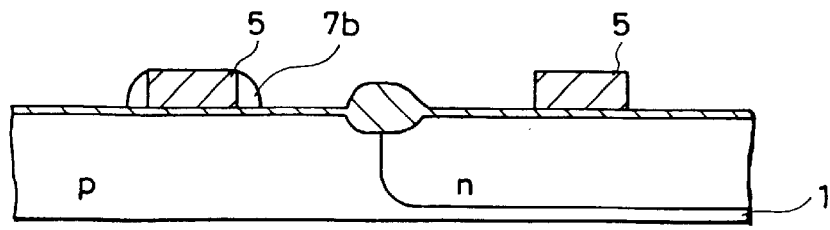
Figure 2F:
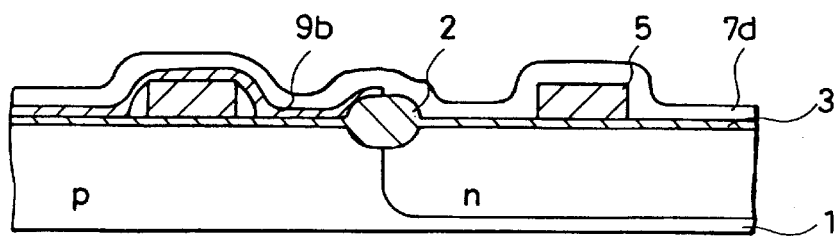
Figure 2G:
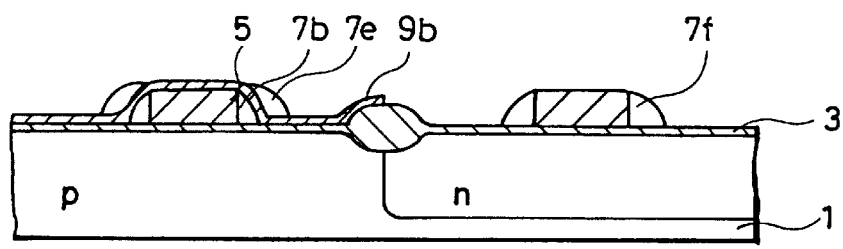
Figure 2H:
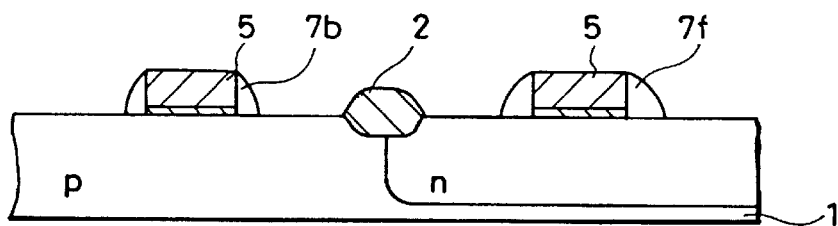
Figure 3A:
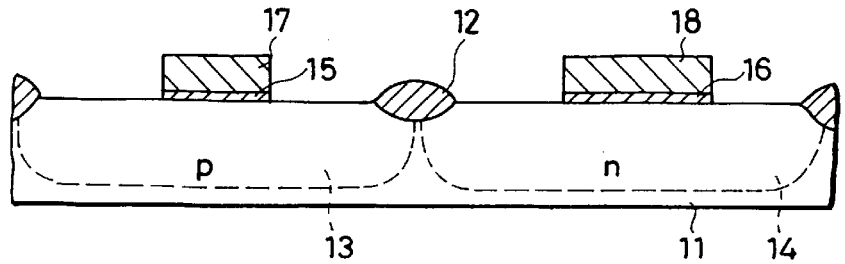
FIGS. 3A, 3B, 3C, 3D, 3E, 3F, 3G, 3H, 3I and 3J are sectional views successively showing steps of manufacturing a field effect transistor according to a first embodiment of the present invention.

According to this embodiment, an element isolation insulating film 12 is first formed by the so-called LOCOS method, in order to separate a semiconductor substrate 11 into a plurality of active regions. Thereafter p-type impurity ions such as boron ions and n-type impurity ions such as phosphorus or arsenic ions are implanted into the active regions, to form a p-type well region 13 and an n-type well region 14 respectively. Then, polycrystalline silicon materials doped with impurities are further deposited on the active regions through gate insulating films 15 and 16, or conductive materials such as metals having high melting points are worked by a well-known method, to form gate electrodes 17 and 18 (FIG. 3A).

Figure 3B:
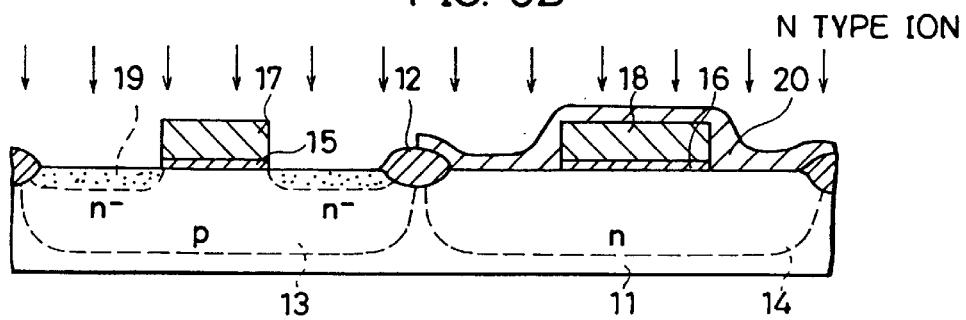

Then, the overall surface of the active region provided with the n-type well 14 is covered with a resist film 20, and n-type impurity ions such as phosphorus or arsenic ions are implanted only into a region for forming an n-channel MOSFET at application density of $10^{12}$ to $10^{14}$ cm$^{-2}$, so that low-concentration n-type diffusion layers 19 are formed on both sides through the gate electrode 17, serving as a mask, in a self-alignment manner (FIG. 3B).

Figure 3C:
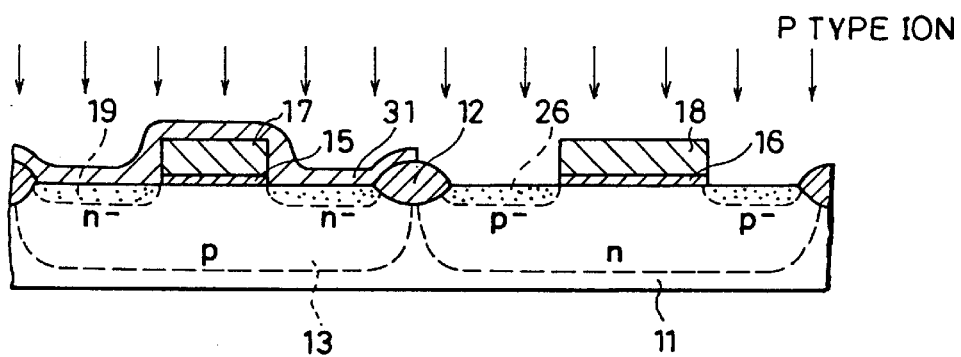

After the resist film 20 is removed, the overall surface of the active region provided with the p-type well is then covered with a resist film 31. Then, p-type impurity ions such as boron ions are implanted only into a region for forming a p-channel MOSFET at an application density of $10^{12}$ to $10^{14}$ cm$^{-2}$, so that low-concentration p-type diffusion layers 26 are formed in a self-aligning manner with the gate electrode 18 serving as a mask (FIG. 3C).

Figure 3D:
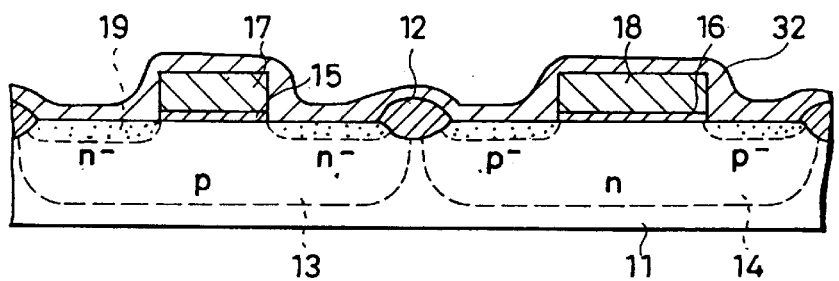
Figure 3E:
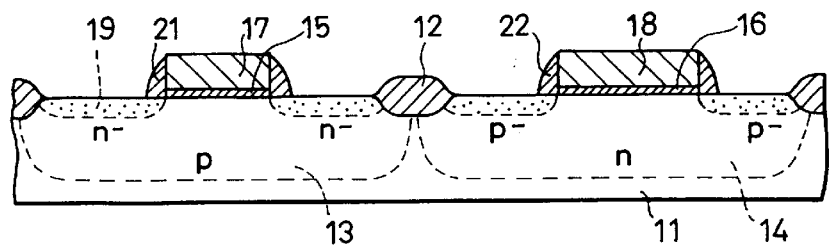

After the resist film 31 is removed, an oxide film 32 is deposited on the overall surface of the semiconductor substrate 11 by the CVD process or the like (FIG. 3D). The deposited oxide film 32 is then subjected to a reactive ion etching, to form side wall spacers 21 and 22 (FIG. 3E). The width of the side wall spacer 21 on the surface of the semiconductor substrate 11 is approximately proportional to the thickness of the oxide film 32.

Figure 3F:
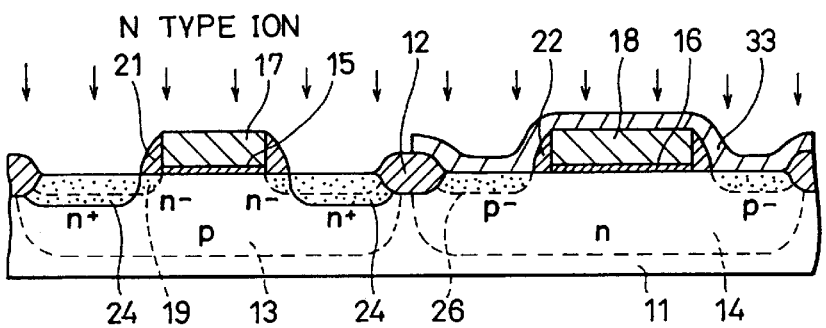

The overall surface on only the n-type well region 14 is then covered with a resist film 33. With the resist film 33 covering the overall surface, n-type impurity ions such as phosphorus or arsenic ions are implanted into the active region of the n-channel MOSFET at an application density of $10^{15}$ to $10^{17}$ cm$^{-2}$. Thus, with the gate electrode 17 and the side wall spacer 21 serving as masks, high-concentration n-type diffusion layers 24 are formed on both sides thereof in a self-alignment manner (FIG. 3F).

Figure 3G:
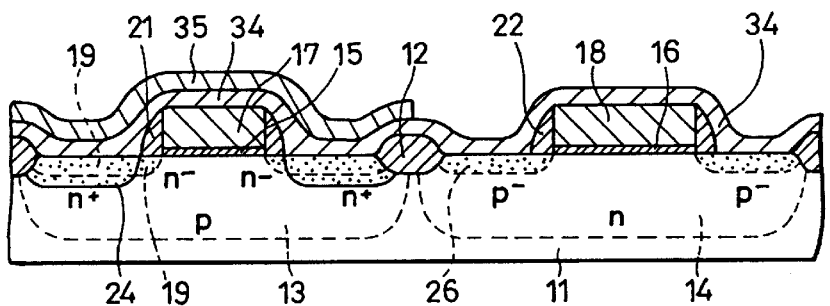
Figure 3H:
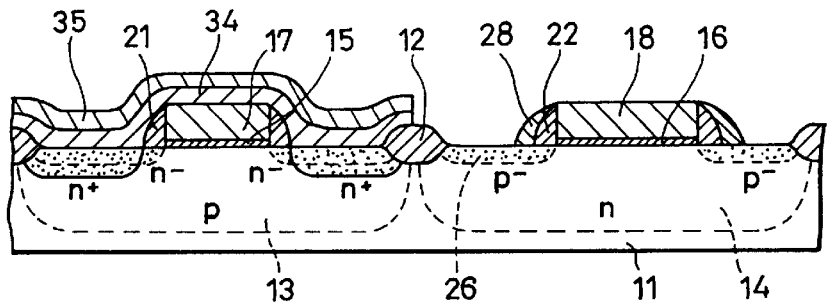
Figure 3I:
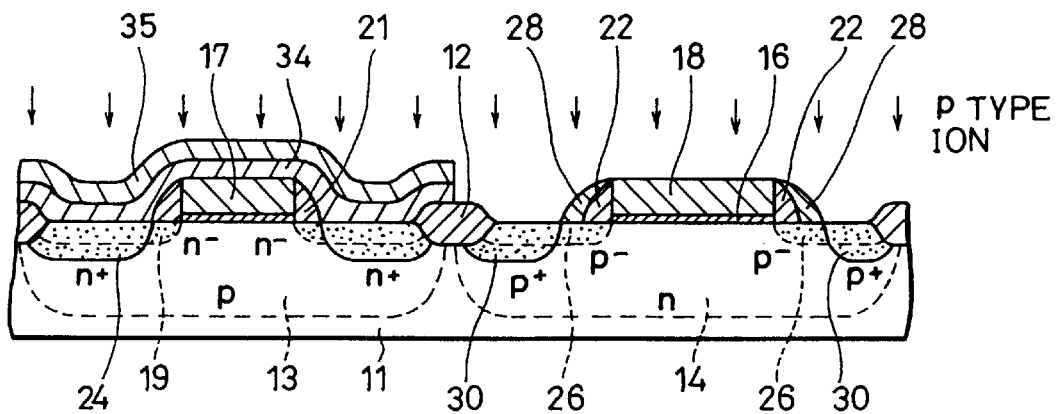

Then, an oxide film 34 is deposited on the overall surface of the semiconductor substrate 11 by CVD, and only the overall surface on the p-type well region 13 is covered with a resist film 35 (FIG. 3G). With the resist film 35 covering the overall surface, the oxide film 34 is subjected to a reactive ion etching, so as to form a side wall spacer 2-8 of a second layer on the n-type well region 14 (FIG. 3H). In this state, p-type impurity ions such as boron ions are implanted into the active region of the p-channel MOSFET at an application density of $10^{15}$ to $10^{17}$ cm$^{-2}$. Accordingly, with the gate electrode 18 and the side wall spacers 22 and 28 serving as masks, high-concentration p-type diffusion layers 30 are formed in a self-alignment manner on both sides thereof (FIG. 3I).

Figure 3J:
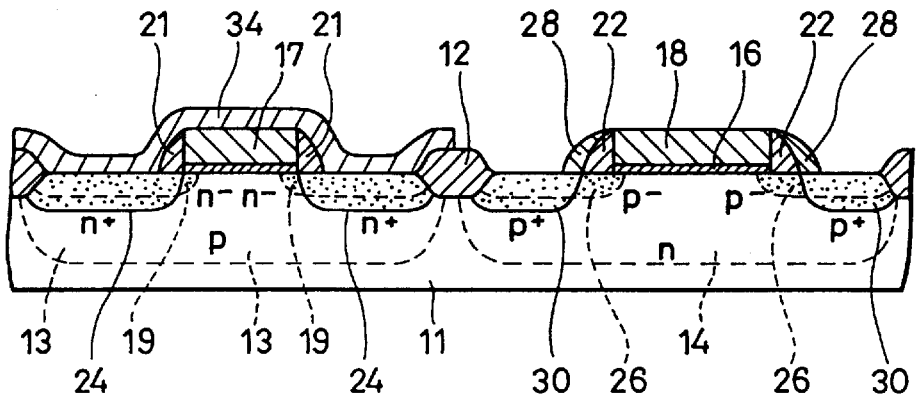

Performing a heat treatment on predetermined conditions after removal of the resist film 35 renders all of the low-concentration n-type diffusion layers 19, the high-concentration n-type diffusion layers 24, the low-concentration p-type diffusion layers 26 and the high-concentration p-type diffusion layers 30 active (FIG. 3J).

A second embodiment of the present invention will now be described with reference to FIGS. 4A through 4H. The steps shown in FIGS. 4A and 4B in this embodiment are the same as the steps shown in FIGS. 3A and 3B in the first embodiment.

Figure 4A:
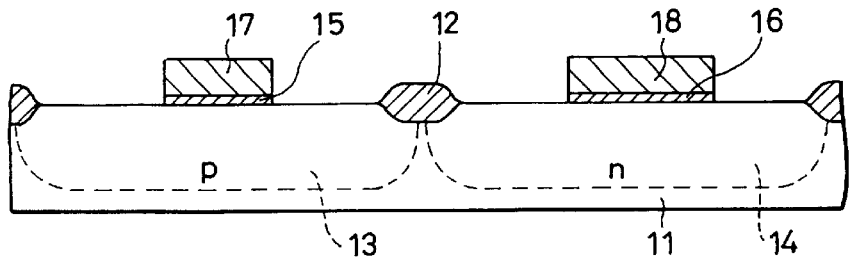
FIGS. 4A, 4B, 4C, 4D, 4E, 4F, 4G and 4H are sectional views successively showing steps of manufacturing a field effect transistor according to a second embodiment of the present invention.
Figure 4B:
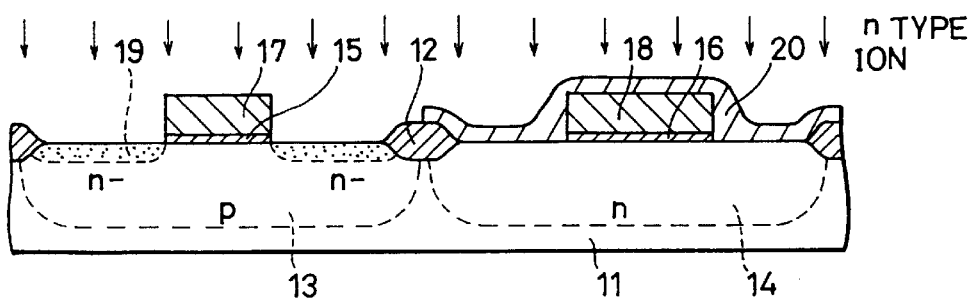
Figure 4C:
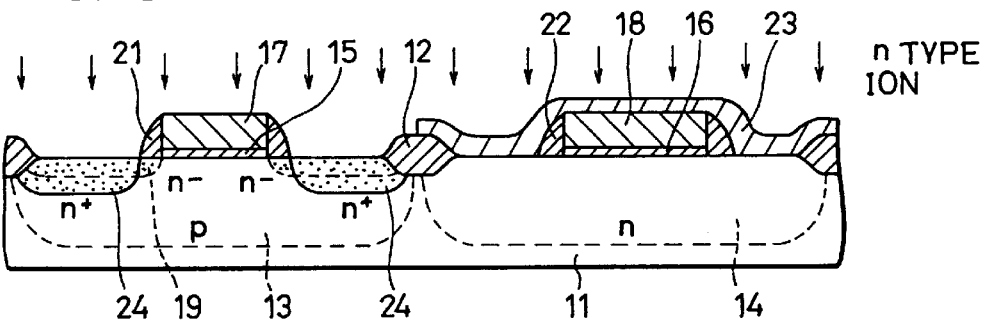

From the state of FIG. 4B, the resist film 20 is removed and an insulating film such as a silicon oxide film is formed by CVD on the overall surface in a certain thickness, and anisotropic etching is performed on the overall surface to form side wall spacers 21 and 22 on side walls of the gate electrodes 17 and 18. Thereafter a resist film 23 is formed on the overall surface of the active region provided with the n-type well 14, and n-type impurity ions are again implanted into the region for forming the n-channel MOSFET, so that high-concentration n-type diffusion layers 24 are formed in a self-alignment manner through the gate electrode 17 and the side wall spacers 21, serving as masks (FIG. 4C).

Figure 4D:
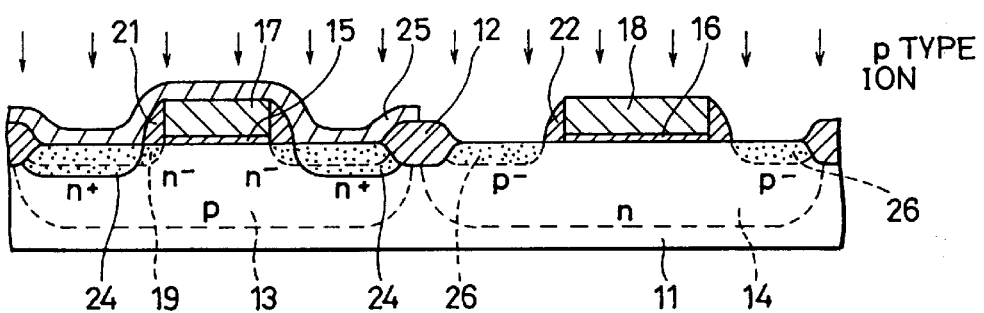

The resist film 23 is removed and another resist film 25 is formed on the overall surface of the active region provided on the p-type well region 13 for forming the n-channel MOSFET. In this state, p-type impurity ions such as boron ions are implanted into the active region for forming a p-channel MOSFET, to form low-concentration p-type diffusion layers 26 in a self-alignment manner through the gate electrode 18 and the side wall spacers 22, serving as masks (FIG. 4D).

Figure 4E:
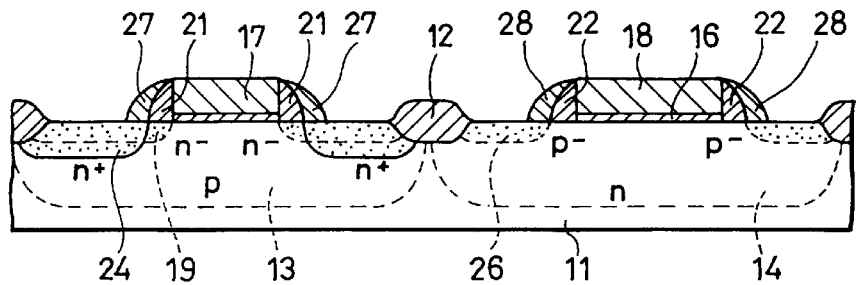

The resist film 25 is removed and an insulating film such as a silicon oxide film is formed on the overall surface in a certain thickness again by CVD, and anisotropic etching is performed on the overall surface, to form side wall spacers 27 and 28 on the side walls of the gate electrodes 17 and 18 (FIG. 4E).

Figure 4F:
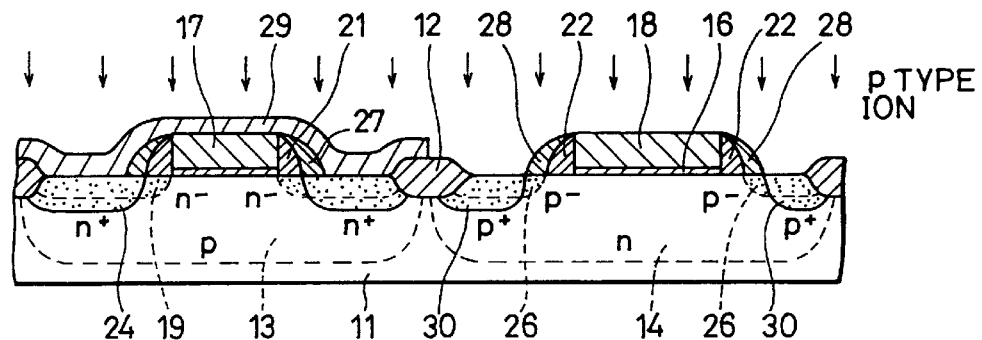

Then the overall surface of the active region for the n-channel MOSFET is covered with a resist film 29, and p-type impurity ions such as boron ions are implanted into the p-channel MOSFET region, so that high-concentration p-type diffusion layers 30 are formed in a self-alignment manner through the gate insulating film 18 and the side wall spacers 27 and 28, serving as masks (FIG. 4F).

Figure 4G:
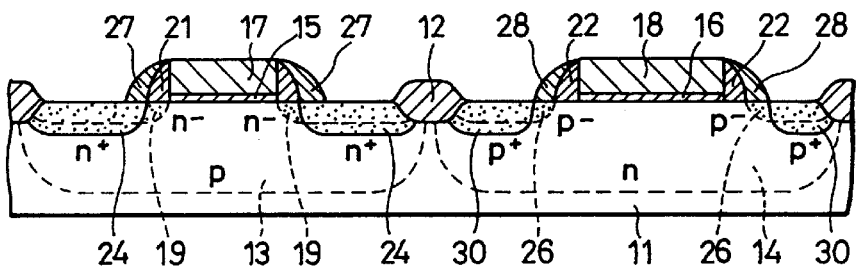
Figure 4H:
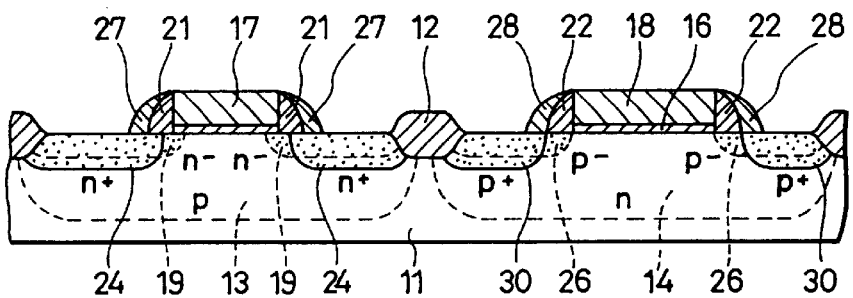

The resist film 29 is removed and heat treatment is performed under prescribed conditions, thereby activating the low-concentration n-type diffusion layers 19, the high-concentration n-type diffusion layers 24, the low-concentration p-type diffusion layers 26 and the high-concentration p-type diffusion layers 30 (FIG. 4G).

Through the aforementioned steps, according to the first and second embodiments, a complementary MOSFET is formed on the semiconductor substrate 11, so that both of the n-channel and p-channel MOSFETs have LDD structures.

According to these embodiments, as hereinabove described, the side wall spacers for the p-channel and n-channel MOSFETs are not formed through separate CVD and anisotropic etching spacers, but simultaneously formed. Further, it is possible to adjust offset lengths of source and drain regions etc. in response to conductivity types of the channels, by inserting the steps of implanting impurity ions between the steps of forming the respective ones of the plurality of side wall spacers. As to self-aligning formation of optimum source and drain regions in response to the conductivity types of the channels, therefore, steps of depositing oxide insulating films by CVD, which require extremely long processing times as compared with patterning of resist films, can be efficiently utilized while maintaining a possibility similar to that for the case of separately forming the side wall spacers. Thus, productivity is improved.

Figure 5A:
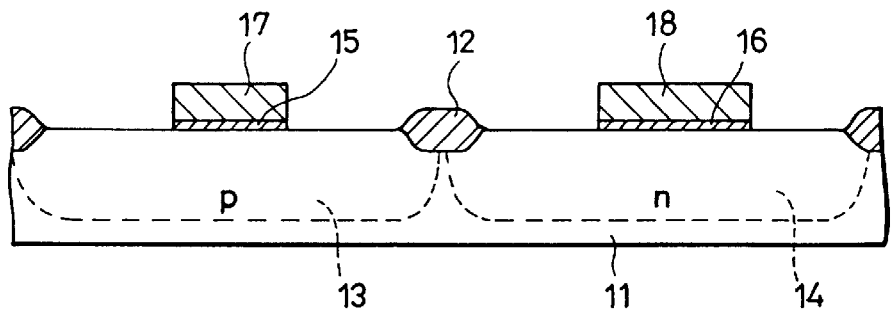
FIGS. 5A, 5B, 5C, 5D, 5E and 5F are sectional views successively showing steps of manufacturing a field effect transistor according to a third embodiment of the present invention.
Figure 5B:
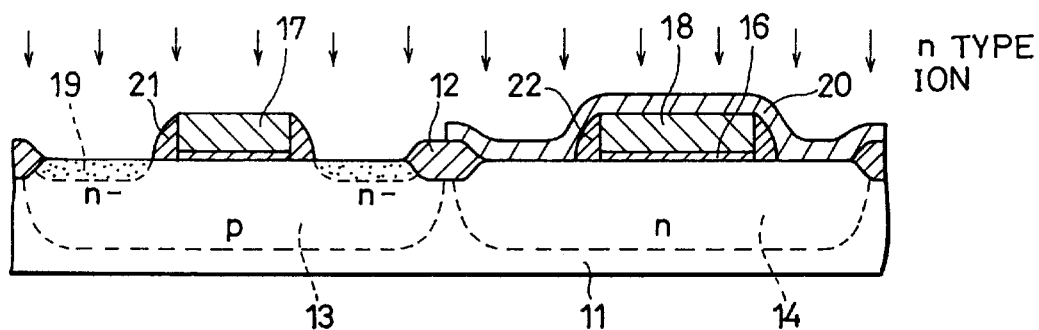
Figure 5C:
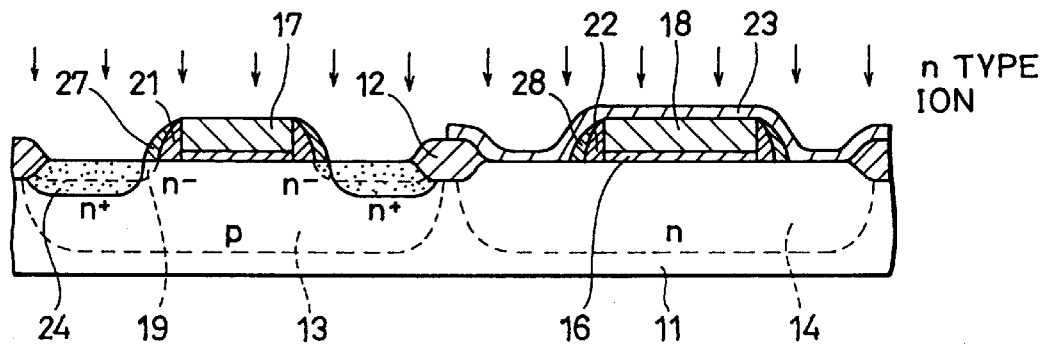

A third embodiment of the present invention is now described with reference to FIGS. 5A to 5F. According to this embodiment, a p-type well region 13 and an n-type well region 14 are formed in active regions of a semiconductor substrate 11 which are isolated by an element isolation insulating film 12 from each other, and gate electrodes 17 and 18 are formed through gate insulating films 15 and 16, similarly to the second embodiment (FIG. 5A). After the gate electrodes 17 and 18 are formed, first-layer side wall spacers 21 and 22 are formed by depositing oxide insulating films by CVD and performing anisotropic etching. Thereafter a region for forming a p-channel MOSFET is covered with a resist film 20, and n-type impurity ions such as phosphorus or arsenic ions are implanted to form low-concentration n-type diffusion layers 19 (FIG. 5B). Thereafter second-layer side wall spacers 27 and 28 are formed, and the region for forming the p-channel MOSFET is again covered with a resist film 23, and n-type impurity ions are implanted to form high-concentration n-type diffusion layers 24 (FIG. 5C).

Figure 5D:
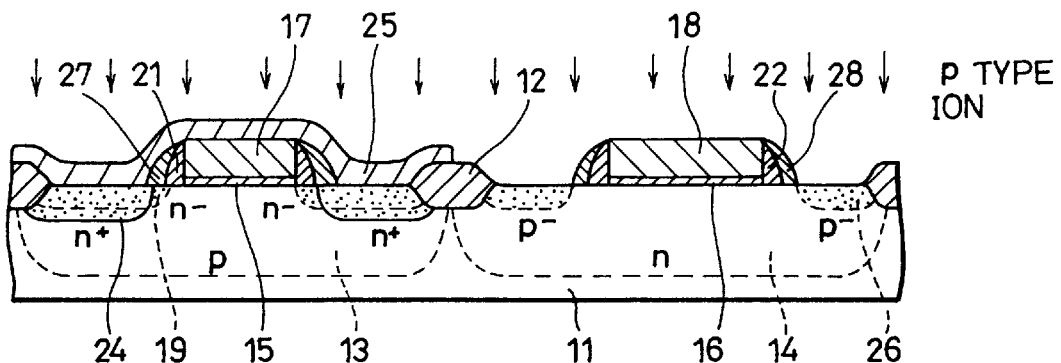
Figure 5E:
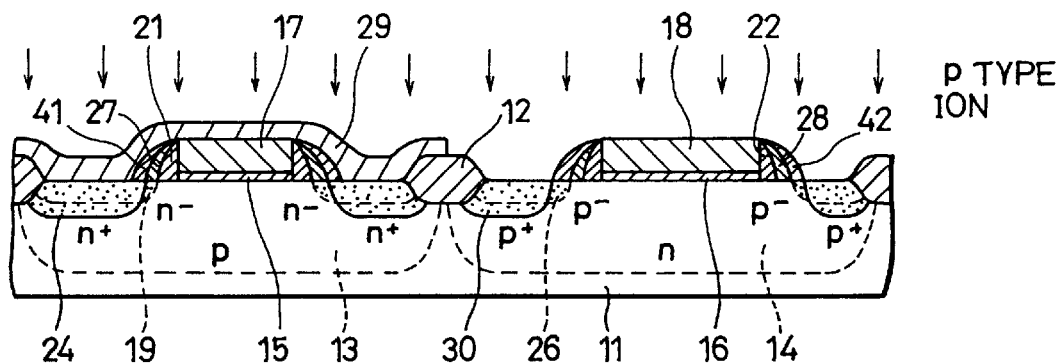
Figure 5F:
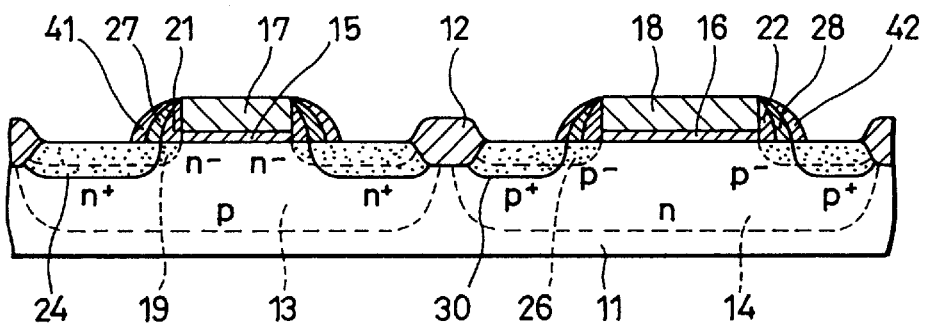

The resist film 23 is then removed and a region for forming an n-channel MOSFET is covered with a resist film 25, and p-type impurity ions such as boron ions are implanted to form low-concentration p-type diffusion layers 26 (FIG. 5D). The resist film 25 is removed, and then third-layer side wall spacers 41 and 42 are formed. Then, the region for forming the n-channel MOSFET is covered with a resist film 29, and p-type impurity ions are further implanted to form high-concentration p-type diffusion layers 30 (FIG. 5E). Thereafter the resist film 29 is removed and heat treatment is preformed under prescribed conditions for activating the respective diffusion layers, thereby attaining a state shown in FIG. 5F.

According to this embodiment, as hereinabove described, a plurality of side wall spacers are formed by successively repeating deposition of oxide insulating films by CVD and anisotropic etching a plurality of times, while selectively forming resist films and implanting impurity ions, similarly to the first and second embodiments. This embodiment is different from the first embodiment in the point that it includes no step of implanting impurity ions through only the gate electrodes 17 and 18, serving as masks, and in the point that the side wall spacers are formed in three-layer structures. Also in this embodiment, it is possible to attain the function/effect of improving efficiency in the steps of forming the side wall spacers, similarly to the first embodiment. In the case of fine transistors of relatively low currents having channel widths of not more than 1 micron, impurity diffusion lengths of source and drain regions are relatively increased with respect to the channel widths. Thus, offsetting must indispensably be achieved by side wall spacers. Considering the fact that a p-type impurity has a larger diffusion coefficient than an n-type impurity, further, the widths of side wall spacers serving as masks for implanting p-type impurity ions must be larger than those of side wall spacers serving as masks for implanting n-type impurity ions. This embodiment satisfies such requirements by increasing the layer numbers of the side wall spacers for implanting p-type impurity ions as compared with those of the side wall spacers for implanting n-type impurity ions.

Figure 7A:
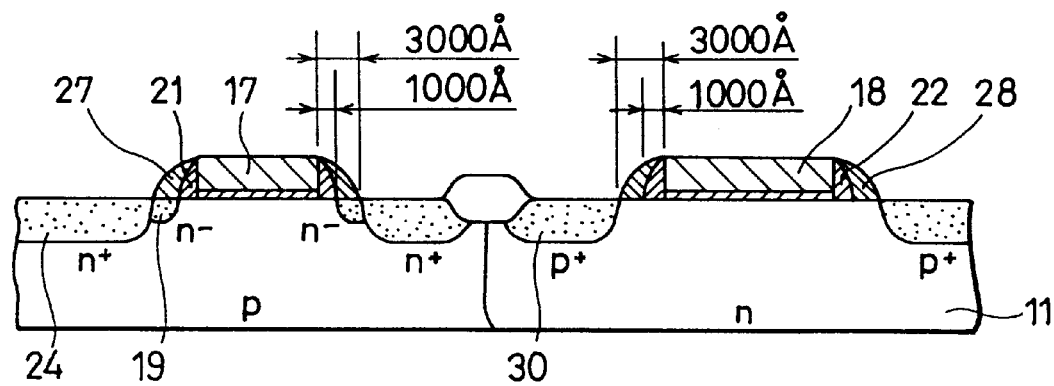
FIGS. 7A and 7B are sectional views showing an example of the difference in profile changes between an n type diffusion layer and a p type diffusion layer in source/drain regions, occurring after and before a heat treatment and caused by the difference in diffusion coefficients between those diffusion layers, in case where an n-channel MOS transistor and a p-channel MOS transistor are formed on the same semiconductor substrate.
Figure 7B:
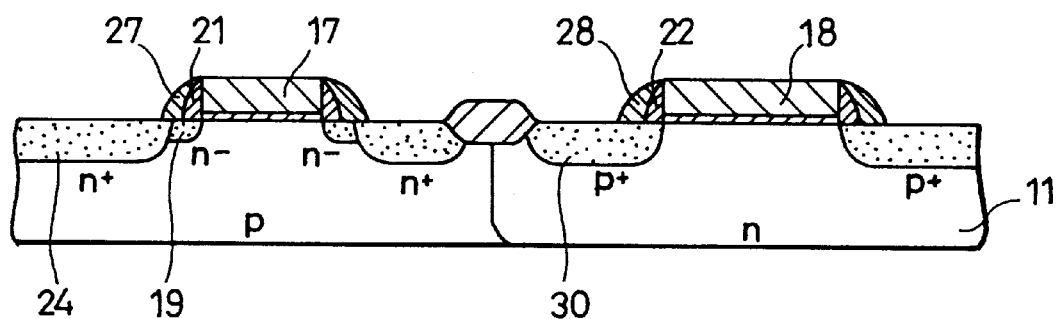

An example, showing in detail the difference in diffusion coefficients between p-type impurities and n-type impurities, will now be described for reference with reference to FIGS. 7A and 7B. In a p-type well for forming an n-channel MOSFET, phosphorus is implanted with a side wall spacer 21 having a width of 1000 Å on the surface of a semiconductor substrate 11, serving as a mask, so as to form low-concentration n-type diffusion layer 19. Further, high-concentration n-type diffusion layers 24 are formed with an additional side wall spacer having a width of 2000 Å, serving as a mask. In an n-type well for forming a p-channel MOSFET, boron is implanted with side wall spacers 22 and 28 having a total width of 3000 Å, serving as masks, so as to form high-concentration p-type diffusion layers 30 as shown in FIG. 7A. After that, a heat treatment is carried out at a temperature of 900–950° C. for about one hour, so that each of the diffusion layers becomes activated, and also concentration distributions move due to thermal diffusion as shown in FIG. 7B. That is, it is found that the thermal diffusion of boron is considerably larger than that of n-type phosphorus or arsenic under the same heat treatment.

In the aforementioned third embodiment, the low-concentration p-type diffusion layers 26 for the p-channel MOSFET forming region can alternatively be formed in advance of the second-layer side walls 27 and 28 through the side wall spacers 22, serving as masks, while covering the region for forming the n-channel MOSFET with a reset films.

If only the low-concentration n-type diffusion layers 19 are formed and no low-concentration p-type diffusion layers 26 are formed in the first-layer side wall spacers 21 and 22 in the third embodiment, only the high-concentration p-type diffusion layers 30 are formed in the source and drain regions of the region for forming the p-channel MOSFET. In this case, only the region for forming the n-channel MOSFET can be brought into an LDD structure.

Figure 6A:
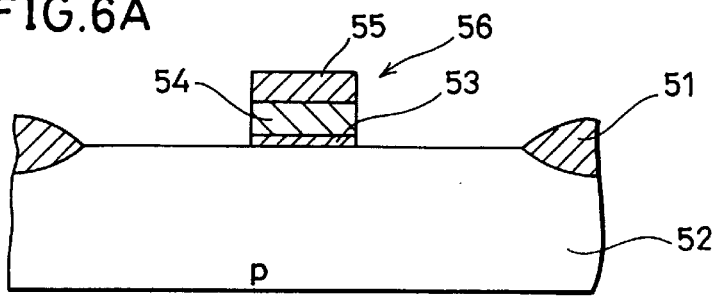
FIGS. 6A, 6B, 6C, 6D, 6E, 6F, 6G and 6H are sectional views successively showing steps of manufacturing a field effect transistor according to a fourth embodiment of the present invention.
Figure 6B:
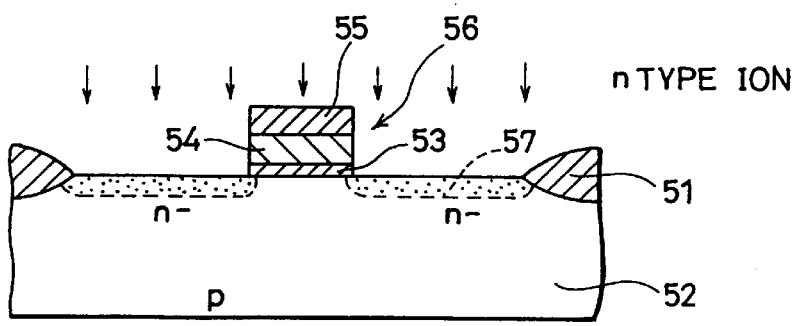
Figure 6C:
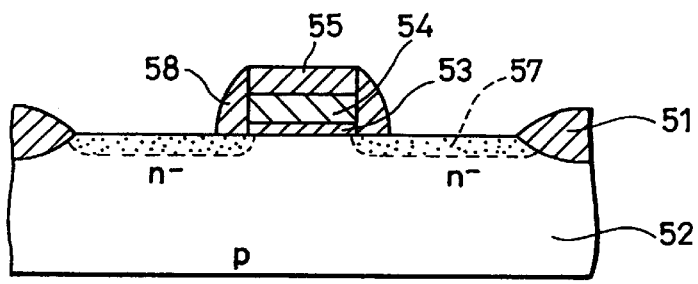
Figure 6D:
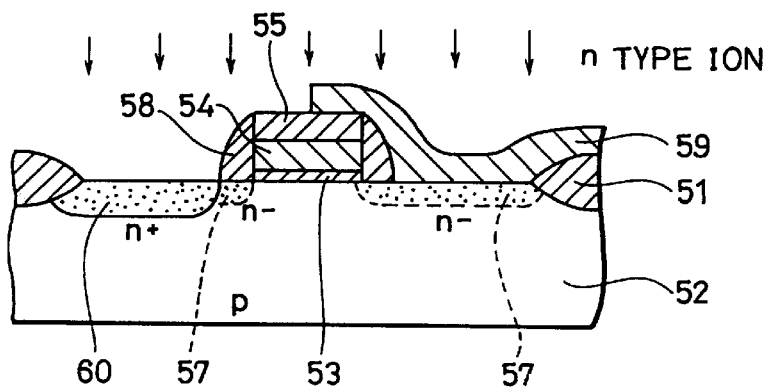

A fourth embodiment of the present invention is now described with reference to FIGS. 6A to 6H. According to this embodiment, a polycrystalline silicon layer 54 is first deposited on a surface of a p-type semiconductor substrate 52, which is separated into active regions by an element isolation insulating film 51, through a gate oxide film 53, and an oxide insulating film 55 is further formed thereon. Then portions of the gate insulating film 53 and the polycrystalline silicon layer 54 are removed by photo etching to leave only a gate electrode part 56, thereby attaining a structure shown in FIG. 6A. Then, n-type impurity ions such as phosphorus or arsenic ions are implanted, to form low-concentration n-type diffusion layers 57 on left and right sides through the gate electrodes part 56, which serves as a mask (FIG. 6B). Thereafter an oxide insulating film of silicon oxide etc. is deposited on the overall surface of the semiconductor substrate 52 by CVD, and anisotropic etching is performed to form side wall spacers 58 (FIG. 6C). Thereafter a right half of the semiconductor substrate 52 is covered with a resist film 59 from the center of the gate electrode part 56, and n-type impurity ions are implanted to form a high-concentration n-type region 60 in a source region through the side wall spacer 58, serving as a mask (FIG. 6D).

Figure 6E:
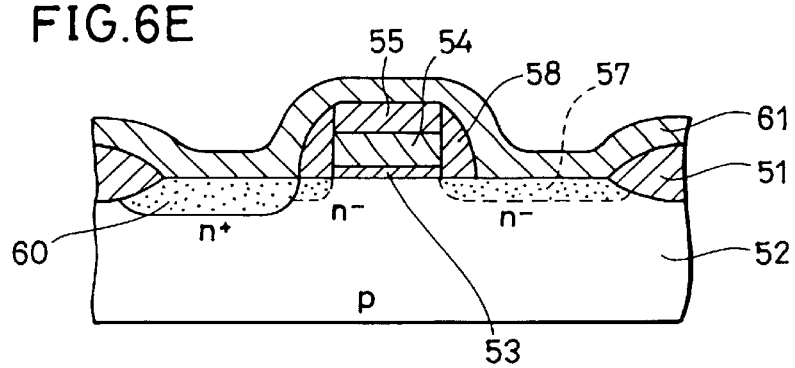
Figure 6F:
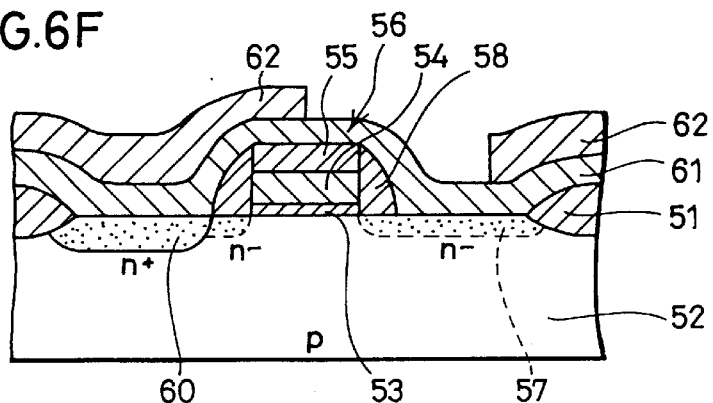
Figure 6G:
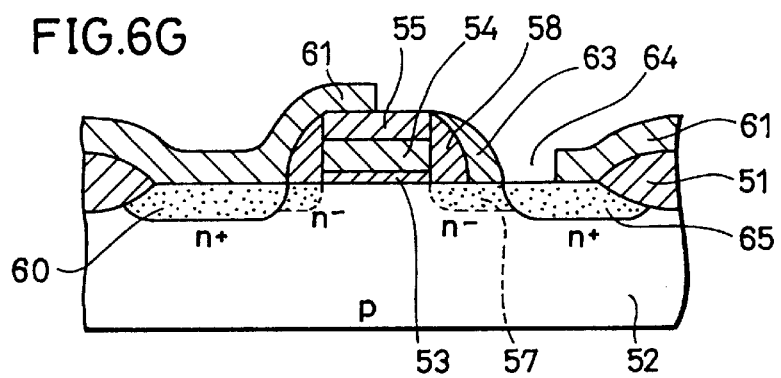

The resist film 59 is removed and then an oxide insulating film 61 of silicon oxide etc. is formed on the overall surface of the p-type semiconductor substrate 52 by CVD (FIG. 6E). Then a resist film 62 is selectively formed excepting a region between the center of the gate electrode part 56 and a drain region (FIG. 6F), and anisotropic etching is performed in this state to form a side wall spacer 63 and a contact hole 64. Then, n-type impurity ions are implanted through the side wall spacer 63, serving as a mask, to form a high-concentration n-type diffusion layer 65 in the drain region in a self-alignment manner (FIG. 6G).

Figure 6H:
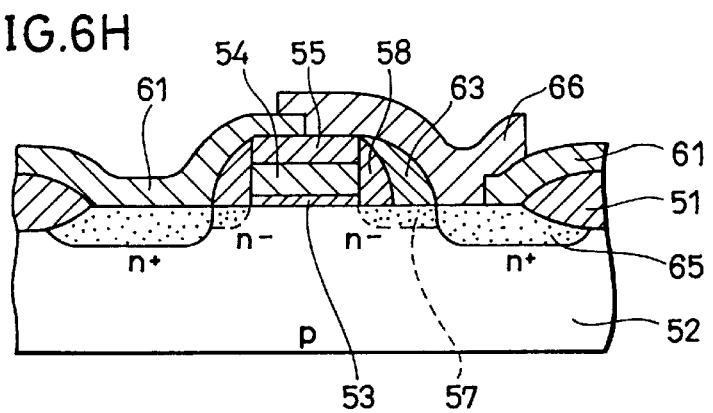

Then, a wiring layer 66, which is selectively provided with a metal layer or a doped polycrystalline silicon layer, is formed to allow conduction of the high-concentration n-type diffusion layer 65 through the contact hole 64 (FIG. 6H).

According to this embodiment, the side wall spacers 58 and 63 are so formed as to lengthen offsetting of the drain side, which is to be provided with the wiring layer 66, while the contact hole 64 is simultaneously formed. Thus, it is possible to effectively improve withstand voltage characteristics of the drain. Further, it is possible to suppress an adverse influence on the low-concentration n-type diffusion layer 57 due to impurity diffusions from the wiring layer 66.

Although the high-concentration n-type diffusion layer 65 is formed by implanting ions after the etching step for forming the side wall spacer 63 in this embodiment, the same can alternatively be formed by diffusion from impurity ions doped in a polysilicon layer which is formed as the wiring layer 66.

The description has been made as to the semiconductor device to which the present invention is applied in the case where the element isolation region is formed by the LOCOS method in each of the foregoing embodiments; however, it is needless to say that the same action and effect can be attained even if the present invention is applied to a semiconductor device in which an element isolation region is formed of a field shield electrode.

Figure 8:
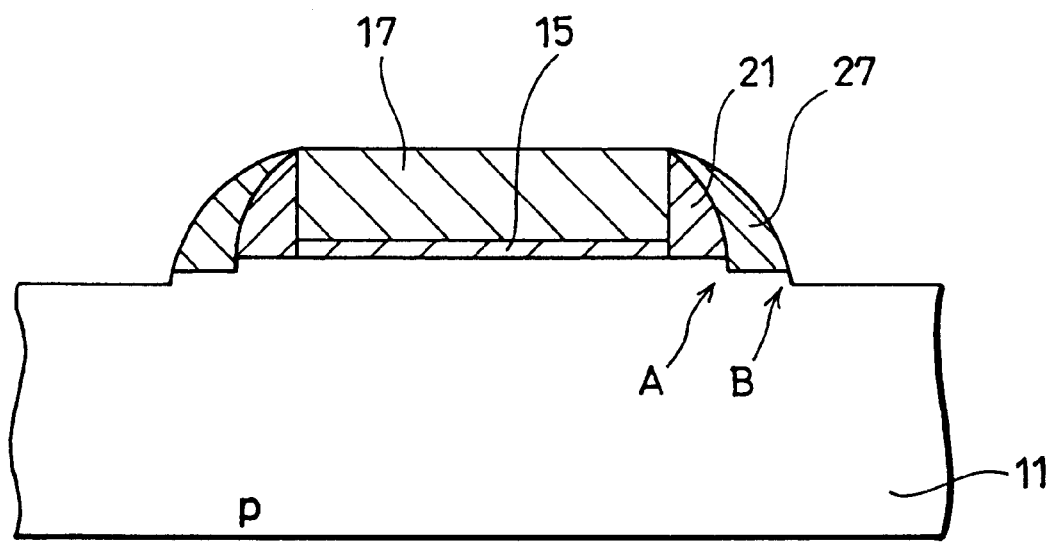
FIG. 8 is a sectional view for use in explaining a step-like configuration produced on the surface of a semiconductor substrate dependently on the number of plural layers forming a side wall spacer.

Further, in the foregoing embodiments, in the case where the side wall spacer is formed of a plurality of layers, it is difficult to identify the boundaries of the respective layers even if observing the cross section of a completed side wall spacer as far as those layers are formed by a CVD employing the same material. This is because a CVD film is amorphous. However, as shown in FIG. 8, step-like configurations (A and B of FIG. 8) are produced by over etching of the surface of the semiconductor substrate 11 upon formation of each of side wall spacers 21 and 27. Therefore, observing the step-like configurations from the cross section of a completed semiconductor device by an electron microscope makes it possible to determine whether or not the side wall spacers are formed of a plurality of layers.

Figure 9:
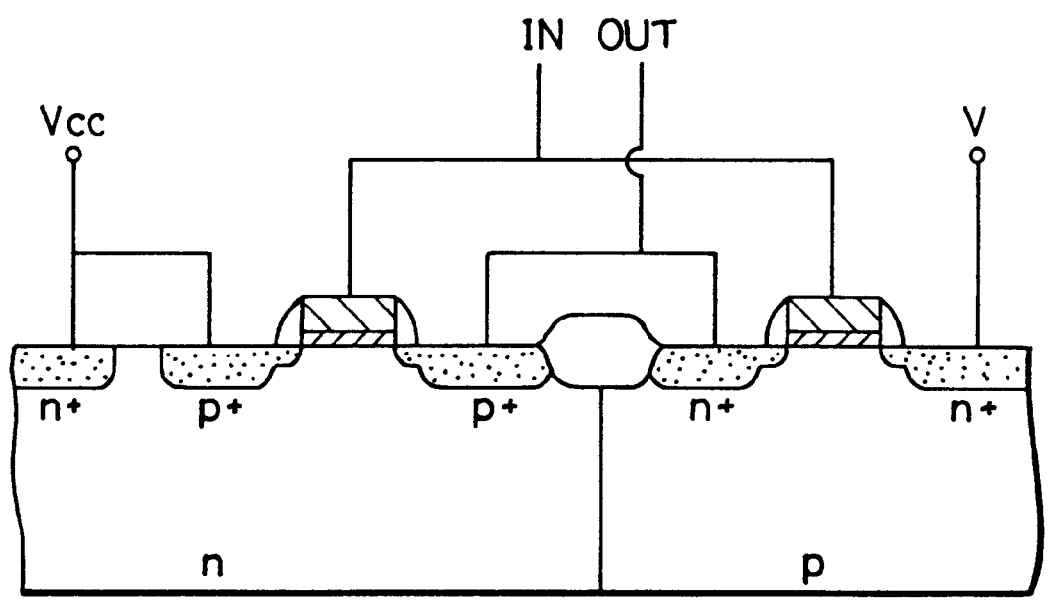
FIG. 9 is a diagram schematically showing a cross-sectional structure of a CMOS inverter to which the present invention is applied and showing connections thereof.

Moreover, the foregoing first through third embodiments are particularly effective for formation of a circuit element of a CMOS structure such as CMOS inverter having the connections shown in FIG. 9.

A fifth embodiment of the present invention is now described with reference to FIGS. 10A to 10K.

Figure 10A:
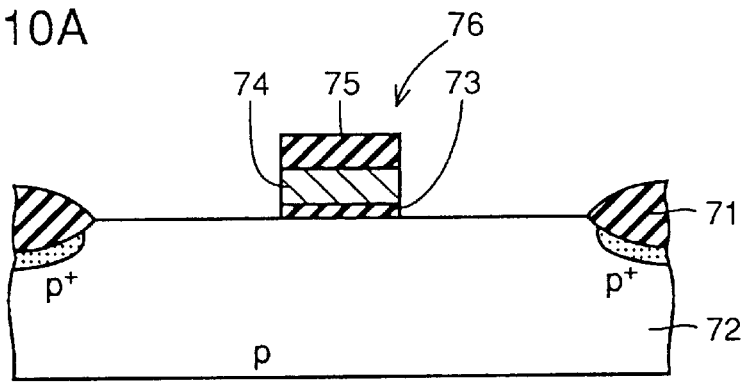
FIGS. 10A to 10K are sectional views successively showing steps of a method of manufacturing a semiconductor device according to a fifth embodiment of the present invention.
Figure 10B:
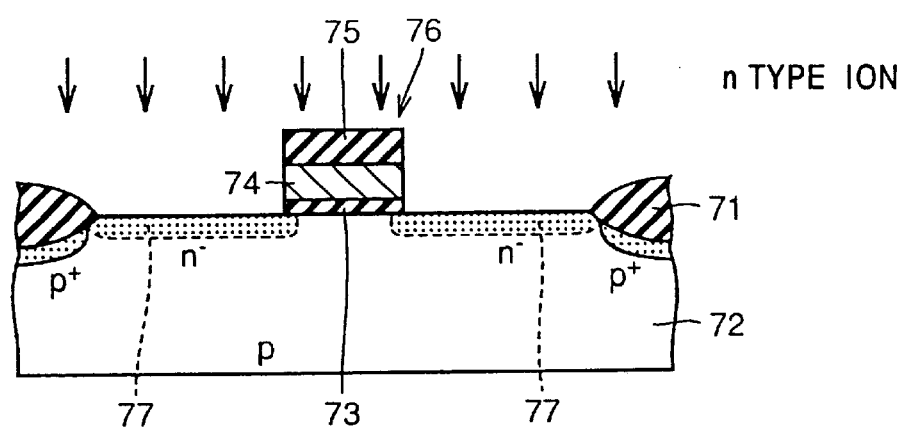
Figure 10C:
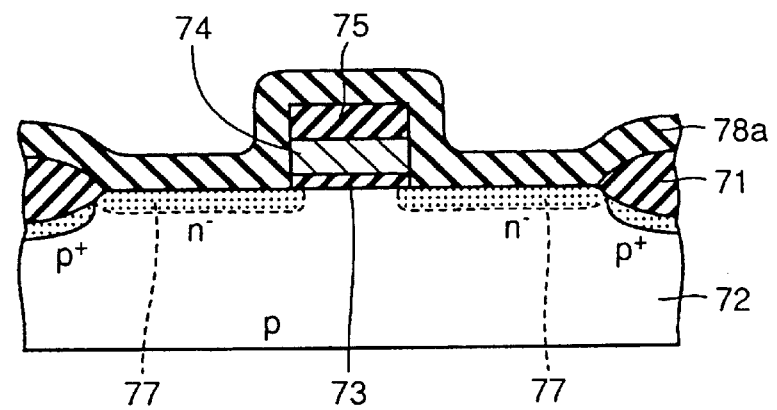

In this embodiment, a polycrystalline silicon layer 74 is first deposited on a surface of a p-type semiconductor substrate 72 which is isolated by an element isolation insulating film 71 with interposition of a gate insulating film 73. Then, an oxide insulating film 75 is formed and thereafter the gate insulating film 73 and the polycrystalline silicon layer 74 is removed by photoetching to leave a gate electrode part 76, thereby forming a structure shown in FIG. 10A. Then, ions of an n-type impurity such as phosphorus or arsenic are implanted to form low-concentration n-type diffusion layers 77 on the left and right sides of the gate electrode part 76 serving as a mask (FIG. 10B). Preferable ion implantation conditions for forming the low-concentration n-type diffusion layers 77 are a dosage of $5\times10^{12}$ to $5\times10^{14}/cm^2$ and implantation energy of 5 to 60 KeV, if the n-type impurity is prepared from phosphorus. If the n-type impurity is prepared from arsenic, on the other hand, preferable ion implantation conditions are a dosage of $5\times10^{12}$ to $5\times10^{14}/cm^2$ similarly to the case of phosphorus, and implantation energy of 15 to 150 KeV. The impurity implantation step may be carried out at an angle which is inclined by 0 to 70° with respect to the normal direction of the semiconductor substrate surface, and the aforementioned ranges of the implantation energy are set in consideration of variation of such an implantation angle.

Figure 10D:
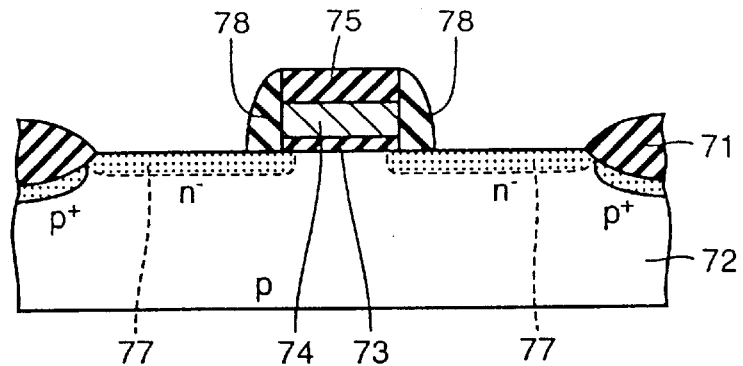
Figure 10E:
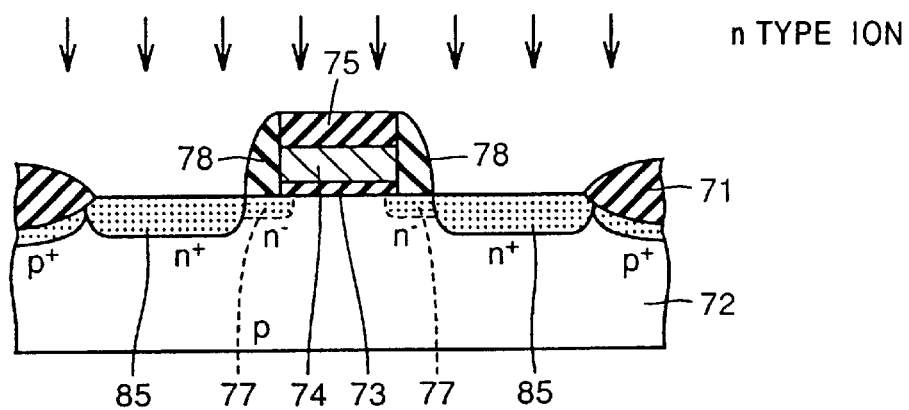

Then, an oxide insulating film 78a of silicon oxide or the like is deposited on the overall upper surface of the semiconductor substrate 72 by CVD (FIG. 10C), and thereafter anisotropic etching is carried out to form first side wall spacers 78 on both side walls of the gate electrode part 76 (FIG. 10D). Thereafter the gate electrode part 76 and the pair of first side wall spacers 78 are employed as masks to implant an n-type impurity such as phosphorus or arsenic, thereby forming $n^+$ layers 85 serving as high-concentration n-type diffusion layers of LDD-structure source/drain regions (FIG. 10E). Preferable ion implantation conditions for forming the $n^+$ layers 85 are a dosage of $5 \times 10^{14}$ to $1 \times 10^{16}/cm^2$ and implantation energy of 10 to 60 KeV if the n-type impurity is prepared from phosphorus. If the n-type impurity is prepared from arsenic, on the other hand, preferable ion implantation conditions are a dosage of $5 \times 10^{14}$ to $1 \times 10^{16}/cm^2$ similarly to the case of phosphorus, and implantation energy of 20 to 150 KeV.

Target concentration values of the $n^-$ layers 77 and the $n^+$ layers 85 are preferably $1 \times 10^{17}$ to $1 \times 10^{19}/cm^3$ and $5 \times 10^{18}$ to $1 \times 10^{21}/cm^3$ respectively.

Figure 10F:
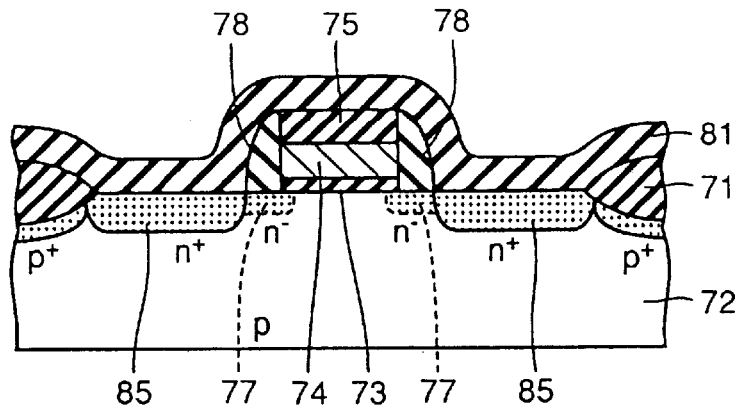
Figure 10G:
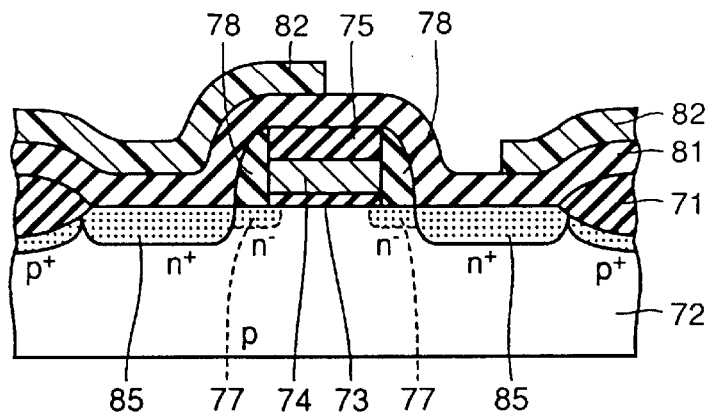
Figure 10H:
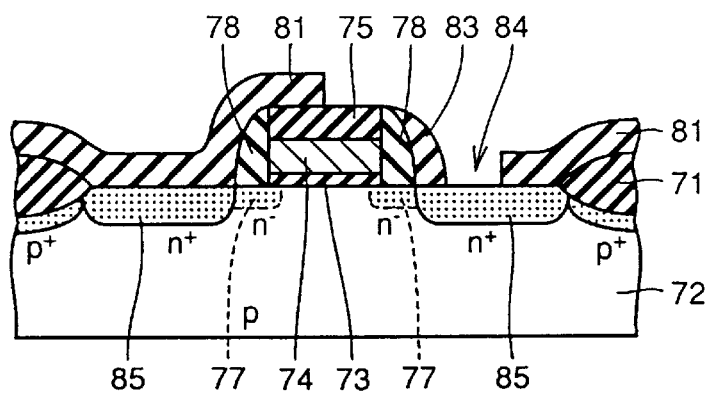
Figure 10I:
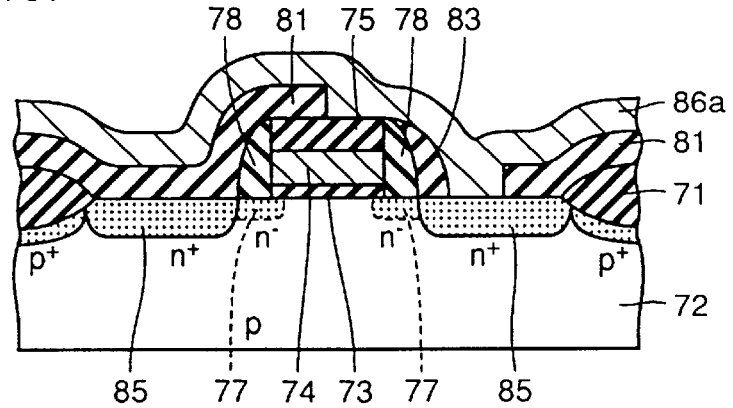
Figure 10J:
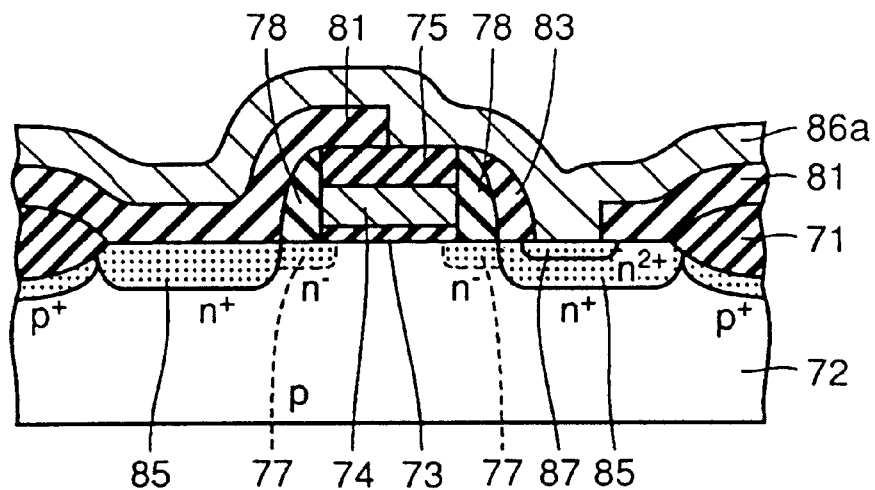
Figure 10K:
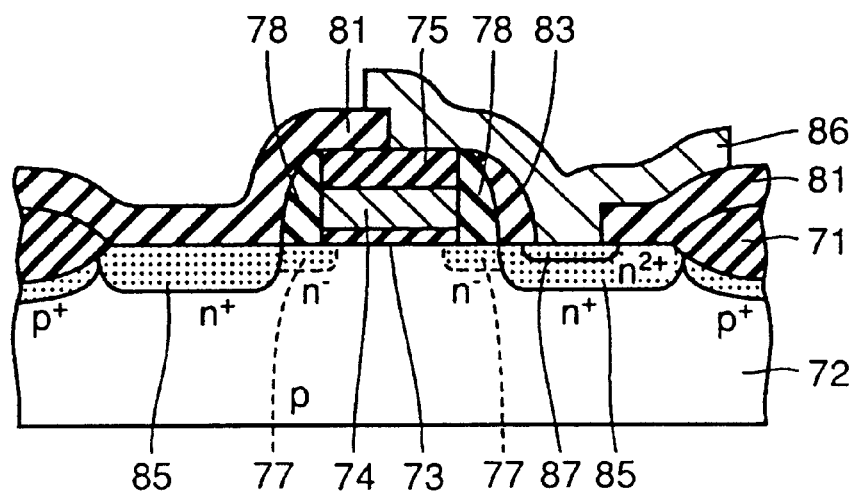

Then, an oxide insulating film 81 of a prescribed thickness is deposited on the overall upper surface of the semiconductor substrate 72 as shown in FIG. 10F, and thereafter a resist film 82 is selectively formed excluding a region between the center of the gate electrode part 76 and one of the source/drain regions (FIG. 10G), and anisotropic etching is carried out in this state, thereby forming a side wall spacer 83 and a contact hole 84 (FIG. 10H). Then, a polycrystalline silicon layer 86a which is doped with an n-type impurity is formed on the overall upper surface of the semiconductor substrate 72 as shown in FIG. 10I, and heat treatment is performed thereon to thermally diffuse the n-type impurity which is doped in the polycrystalline silicon layer 86a into the semiconductor substrate surface, thereby forming a high-concentration n-type impurity layer ($n^{2+}$ layer) 87 which is higher in concentration than the $n^+$ layers 85 (FIG. 10J). Thereafter prescribed patterning is carried out on the polycrystalline silicon layer 86a, thereby forming a conductive layer 86 which is connected with the source/drain region at the high-concentration n-type impurity layer 87 (FIG. 10K).

While the heat treatment for forming the high-concentration n-type impurity layer 87 is carried out before the conductive layer 86 is formed by patterning, the high-concentration n-type impurity layer 87 can alternatively be formed by carrying out heat treatment after the conductive layer 86 is formed by patterning for diffusing the n-type impurity contained in the conductive layer 86 into the surface of the semiconductor substrate 72.

The n-type impurity concentration in the polycrystalline silicon layer 86a or the conductive layer 86 formed by patterning the same is about 5 to $6 \times 10^{20}/cm^3$ for both of phosphorus and arsenic, and up to about $5 \times 10^{21}/cm^3$ at the maximum. The target concentration value of the $n^{2+}$ layer 87 which is formed by the so-called automatic doping from the polycrystalline silicon layer 86a or the conductive layer 86 having such n-type impurity concentration is set to be $5 \times 10^{19}$ to $5 \times 10^{21}/cm^3$ in the finished product.

According to this embodiment, the laterally symmetrical pair of source/drain regions having LDD structures are formed in a self-alignment manner by high accuracy position control so that the widths of the first side wall spacers 78 on the surface of the semiconductor substrate 72 are substantially coincident with those of the $n^-$ layers 77, i.e., offset values of the $n^+$ layers 85 from side ends of the gate electrode part 76. The distance between the $n^{2+}$ layer 87 and the side end of the gate electrode 76 is also reliably controlled in a self-alignment manner by the first and second side wall spacers 78 and 83, so that the $n^{2+}$ layer 87 is reliably located inside the $n^+$ layer 85.

While the conductive material for forming the conductive layer 86 is prepared from the polycrystalline silicon layer 86a which is doped with the n-type impurity, the polycrystalline silicon may be replaced by amorphous silicon. Also when amorphous silicon is employed, concentration of the n-type impurity contained therein and heat treatment conditions for thermal diffusion are identical to those in the case of polycrystalline silicon.

As to the aforementioned formation of the $n^{2+}$ layer 87 by thermal diffusion, it is not inevitably necessary to include an independent heat treatment step which is dedicated thereto, but the $n^{2+}$ layer 87 can alternatively be simultaneously formed in a heat treatment step for another purpose such as activation of the source/drain regions, for example.

Figure 11:
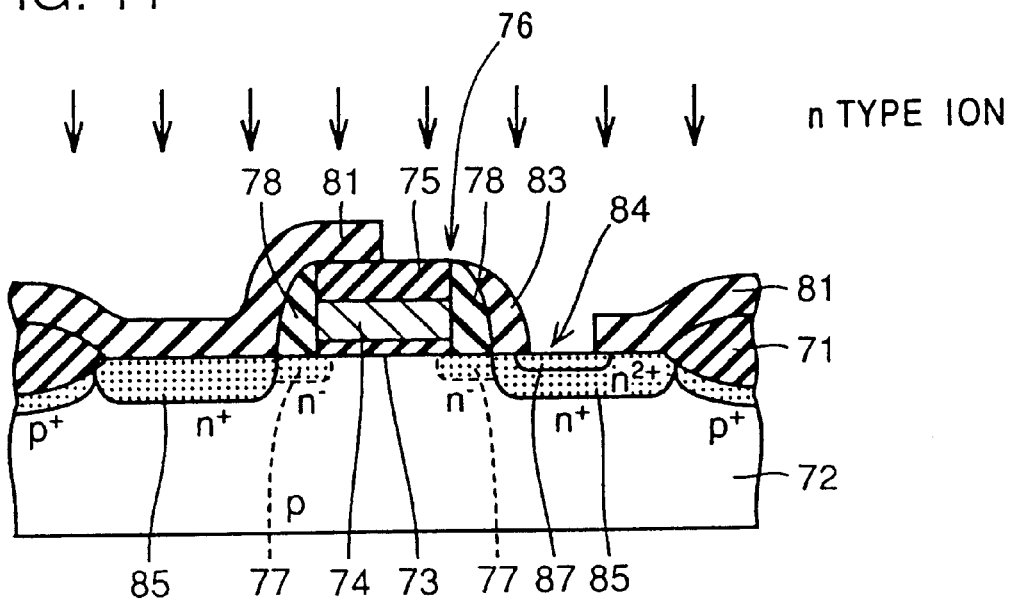
FIG. 11 is a sectional view showing a modification of a step for forming an $n^{2+}$ layer 87 in the method of manufacturing a semiconductor device according to the fifth embodiment of the present invention.

Further, the $n^{2+}$ layer 87 can alternatively formed by ion-implanting an n-type impurity such as phosphorus or arsenic through the gate electrode part 76, the side wall spacer 83 and the oxide insulating film 81 serving as masks as shown in FIG. 11, without employing the so-called automatic doping.

A sixth embodiment of the present invention is now described with reference to FIGS. 12A to 12H. Referring to this embodiment, elements identical or corresponding to those of the first embodiment are denoted by the same reference numerals, to omit redundant description.

Figure 12A:
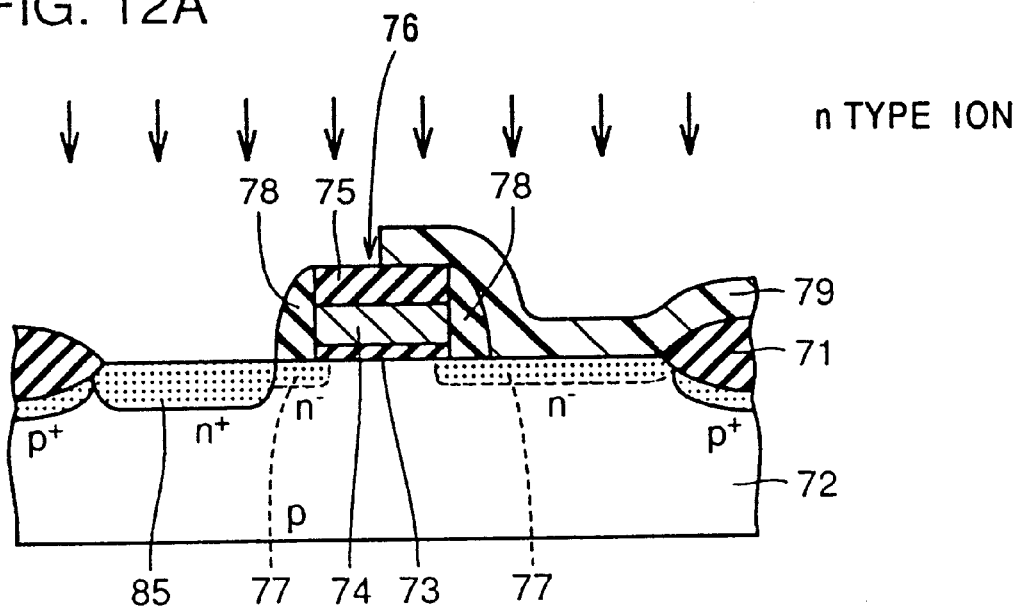
FIGS. 12A to 12H are sectional views successively showing steps of a method of manufacturing a semiconductor device according to a sixth embodiment of the present invention.
Figure 12B:
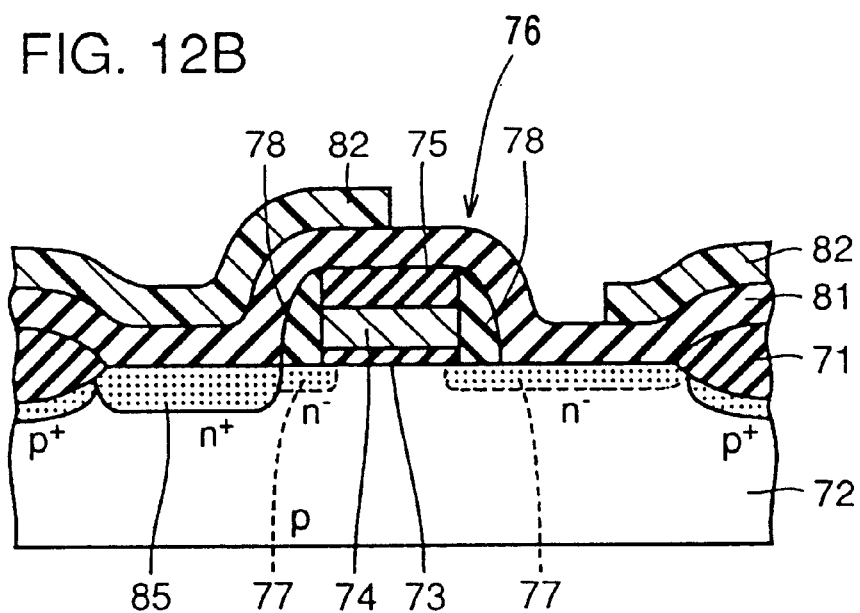
Figure 12C:
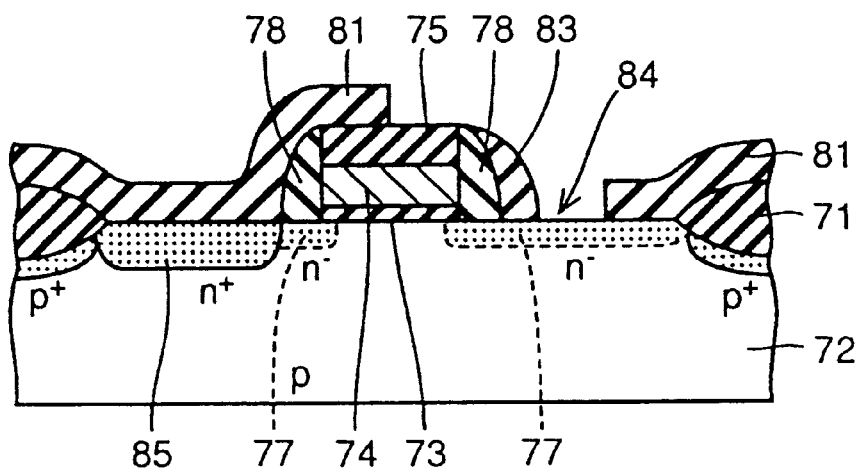

According to this embodiment, steps which are similar to those described above with reference to FIGS. 10A to 10D are first carried out, and thereafter a region rightward beyond the center of a gate electrode part 76 is covered with a resist film 79 and an n-type impurity such as phosphorus or arsenic is implanted, thereby forming an $n^+$ layer 85 only in a region on the left side of the gate electrode part 76, as shown in FIG. 12A. Thereafter the resist film 79 is removed, and then an oxide insulating film 81 of a prescribed thickness is deposited on the overall upper surface of a semiconductor substrate 72, as shown in FIG. 12B. Thereafter a resist film 82 is formed on an upper surface of the oxide insulating film 81 by patterning, to open only a region between the center of the gate electrode part 76 and a right source/drain region. In this state, anisotropic etching is performed on the oxide insulating film 81, and the resist film 82 is removed to attain a structure shown in FIG. 12C.

Figure 12D:
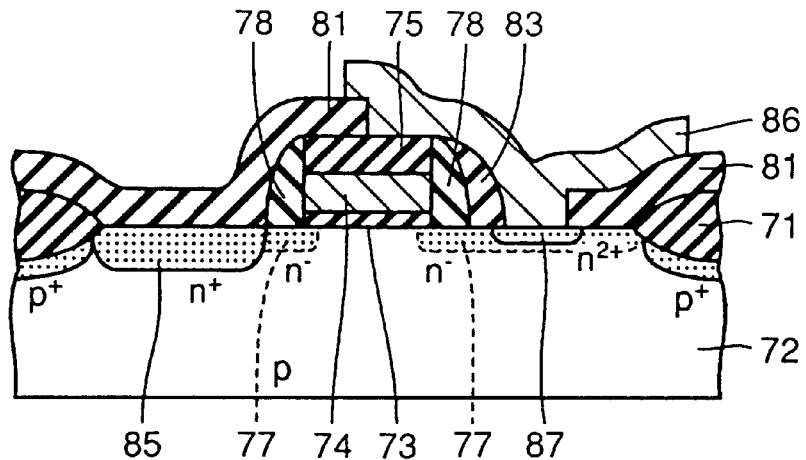

Thereafter steps which are similar to those described above with reference to FIGS. 10J and 10K are carried out to complete a structure shown in FIG. 12D, i.e., that including a patterned conductive layer 86 and an $n^{2+}$ layer 87. The material and impurity concentration of the conductive layer 86 and the method of forming the $n^{2+}$ layer 87 can be similar to those in the fifth embodiment.

When the method according to this embodiment is applied to formation of a memory cell of a DRAM (dynamic random access memory), steps shown in FIGS. 12E to 12H are subsequently carried out.

Figure 12E:
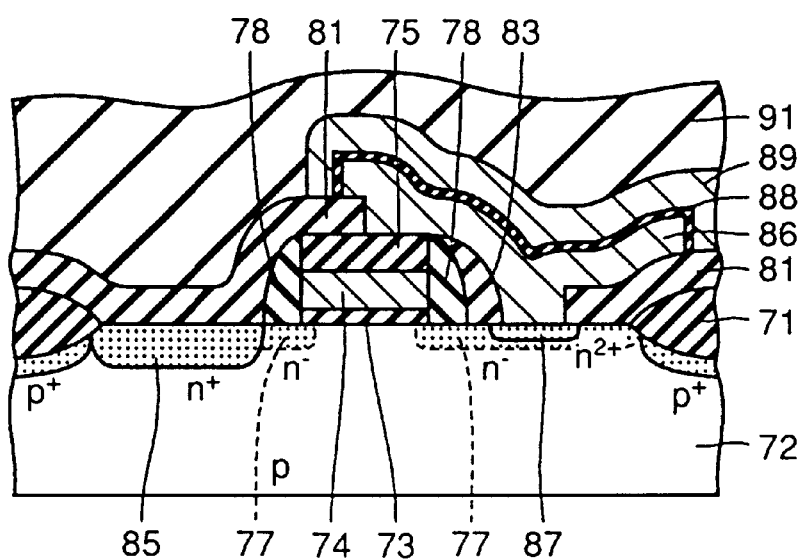
Figure 12F:
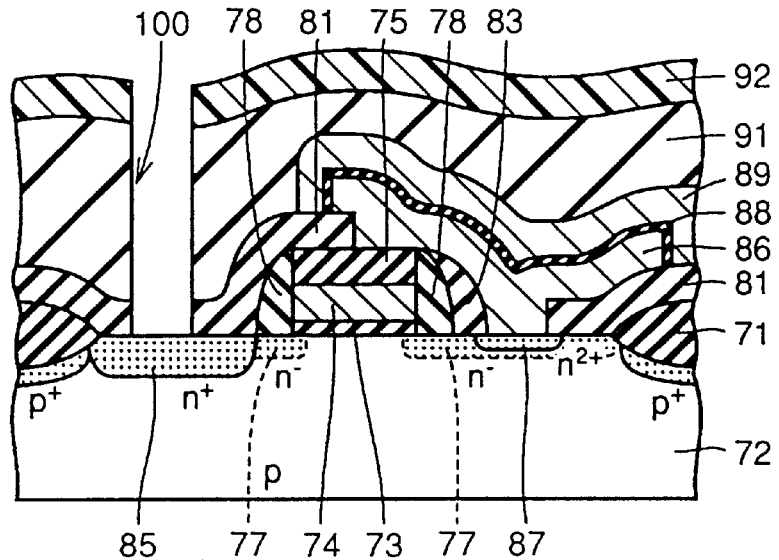

As shown in FIG. 12E, a conductive layer 89 is formed to cover the exposed surface of the conductive layer 86, with interposition of an insulating film 88. Thereafter an interlayer insulating film 91 is formed on the overall upper surface of the semiconductor substrate 72, and a resist film 92 having an opening in a position for forming a contact hole is formed on the surface of the interlayer insulating film 91 by patterning for performing anisotropic etching through the resist film 92 serving as a mask, thereby forming a contact hole 100 reaching the upper surface of the semiconductor substrate 72 (FIG. 12F).

Figure 12G:
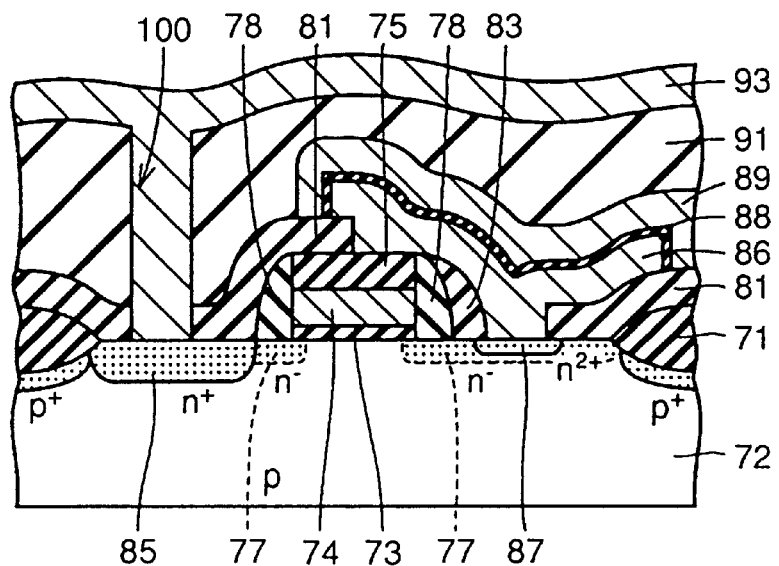
Figure 12H:
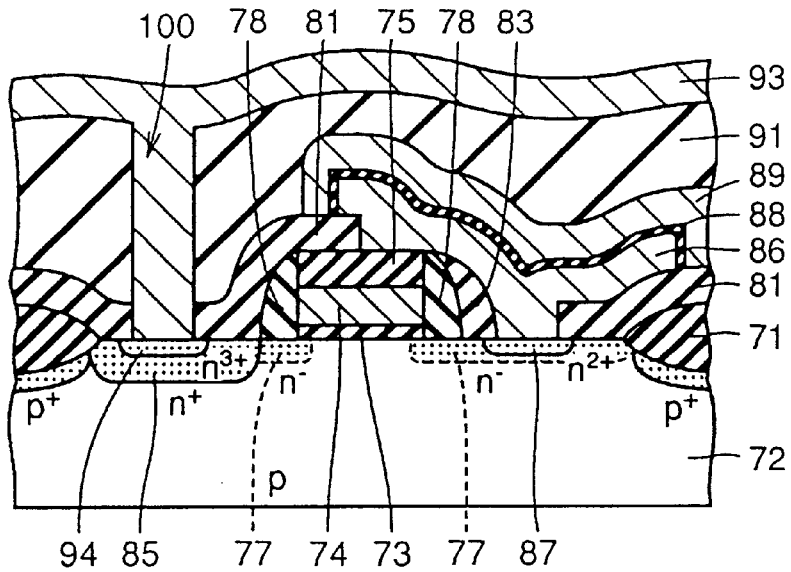

Then, a polycrystalline silicon layer 93 which is doped with an n-type impurity is formed on the upper surface of the interlayer insulating film 91 including the interior of the contact hole 100 (FIG. 12G), and heat treatment is carried out to thermally diffuse the n-type impurity contained in the polycrystalline silicon layer 93, thereby forming a high-concentration n-type impurity layer ($n^{3+}$ layer) 94 which is higher in n-type impurity concentration than the $n^+$ layer 85 inside the $n^+$ layer 85, as shown in FIG. 12H.

Ion implantation conditions for forming the $n^{3+}$ layer 94 and the target concentration value can be set similarly to those for the $n^{2+}$ layer 87 in the first embodiment.

When the structure shown in FIG. 12H is that of a memory cell of a DRAM, the conductive layer 86, the insulating film 88, the conductive layer 89 and the polycrystalline silicon layer 93 form a storage node of a capacitor, a capacitor insulating film, a cell plate and a bit line respectively.

Figure 13:
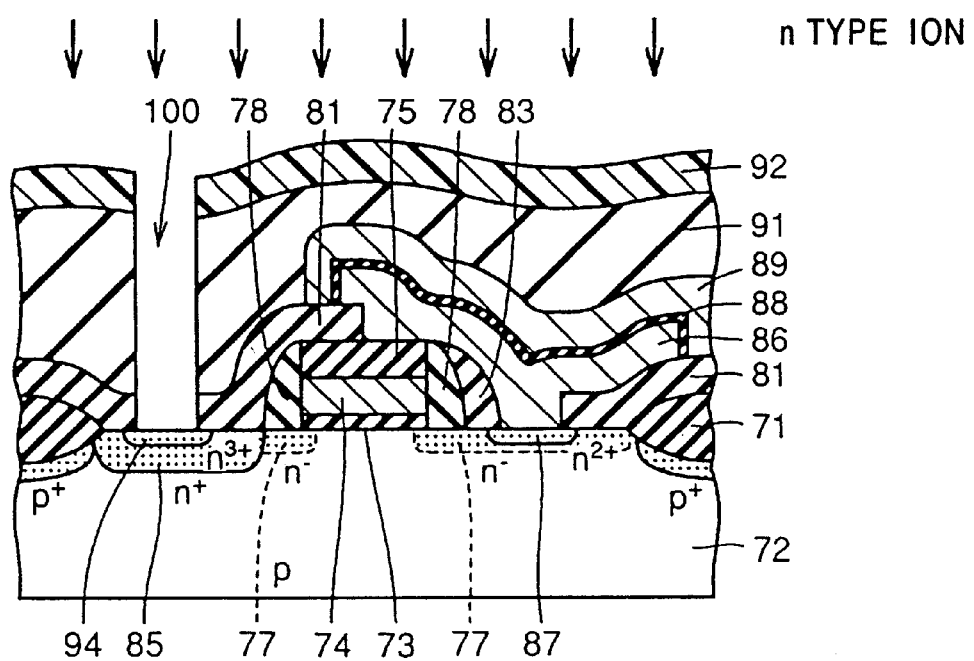
FIG. 13 is a sectional view showing a modification of a step for forming an $n^{3+}$ layer in the method of manufacturing a semiconductor device according to the sixth embodiment of the present invention.

According to this embodiment, the $n^{3+}$ layer 94 can alternatively be formed by ion-implanting an n-type impurity in the stage shown in FIG. 12F through the contact hole 100 as shown in FIG. 13, without employing the so-called automatic doping from the polycrystalline silicon layer 93.

According to this embodiment, as hereinabove described, the $n^{3+}$ layer can be relatively readily formed in a properly controlled position inside the source/drain region ($n^-$ layer 77) having no double structure in a MOS field effect transistor having a laterally asymmetrical LDD structure. Consequently, preferable manufacturing steps for forming a memory cell of a DRAM are proposed.

The steps for forming a memory cell of a DRAM described in relation to this embodiment with reference to FIGS. 12E to 12H and 13 are substantially similarly applicable following the step shown in FIG. 10K in the aforementioned fifth embodiment, as a matter of course.

A seventh embodiment of the present invention is now described with reference to FIGS. 14A to 14H.

Figure 14A:
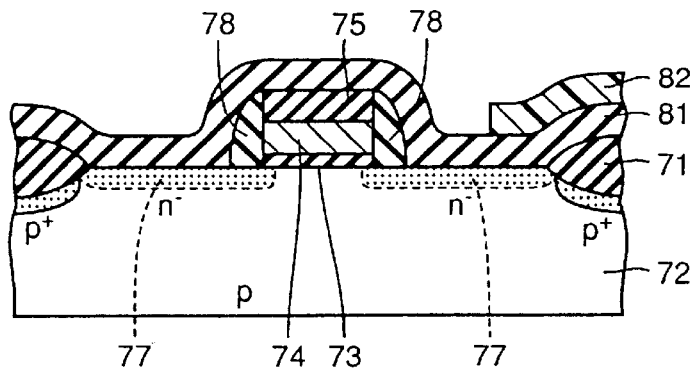
FIGS. 14A to 14H are sectional views successively showing steps of a method of manufacturing a semiconductor device according to a seventh embodiment of the present invention.
Figure 14B:
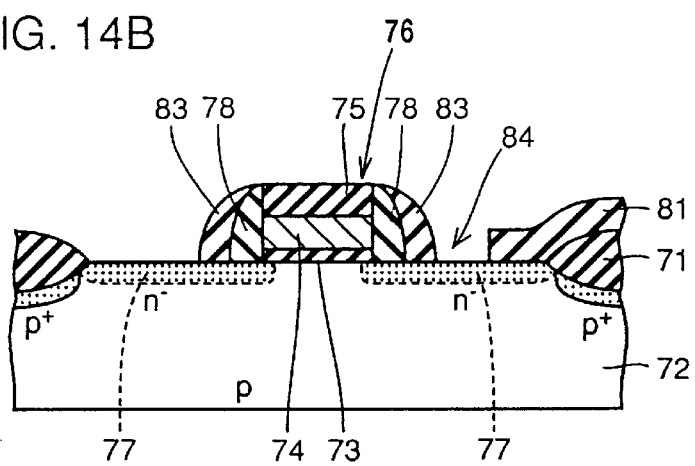
Figure 14C:
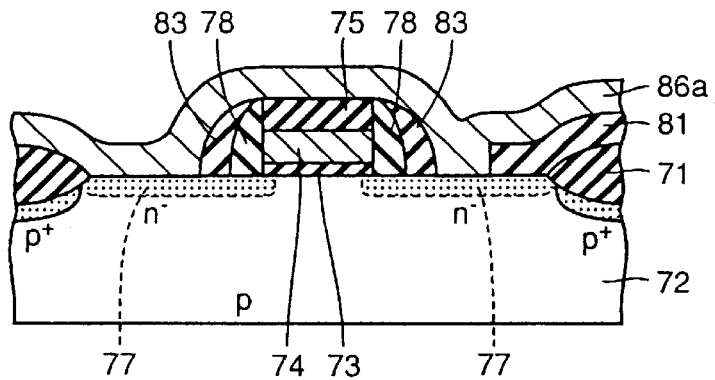
Figure 14D:
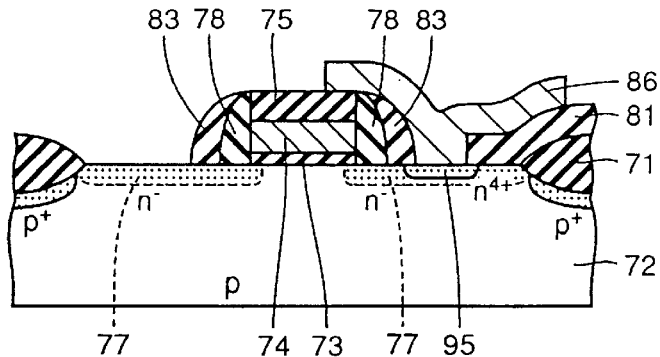

According to this embodiment, steps which are similar to those described with reference to FIGS. 10A to 10D are first carried out and thereafter an oxide insulating film 81 of a prescribed thickness is formed on the overall upper surface of a semiconductor substrate 72, as shown in FIG. 14A. Thereafter a part of the surface of the oxide insulating film 81 is covered with a resist film 82, and anisotropic etching is carried out to form a second pair of side wall spacers 83 on both side walls of a gate electrode part 76, as shown in FIG. 14B. Thereafter a polycrystalline silicon layer 86a which is doped with an impurity is formed on the overall upper surface of the semiconductor substrate 72 as shown in FIG. 14C, and patterned to form a conductive layer 86 as shown in FIG. 14D. An $n^{4+}$ layer 95 which is similar in concentration to the $n^{2+}$ layer 87 in the fifth embodiment is formed on a part of the semiconductor substrate surface in the connecting portion between the conductive layer 86 and the semiconductor substrate 72, through a step similar to that of the fifth embodiment.

Figure 14E:
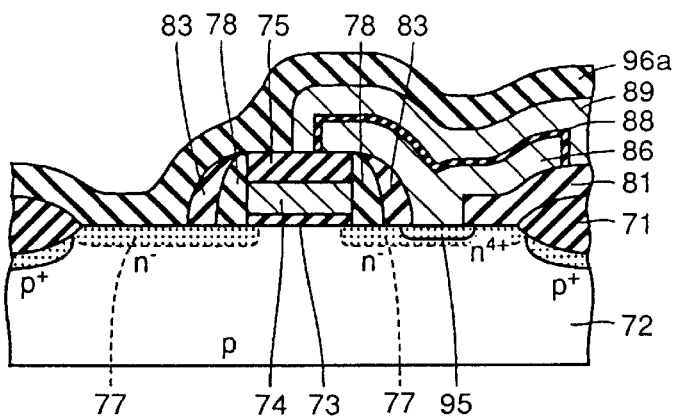
Figure 14F:
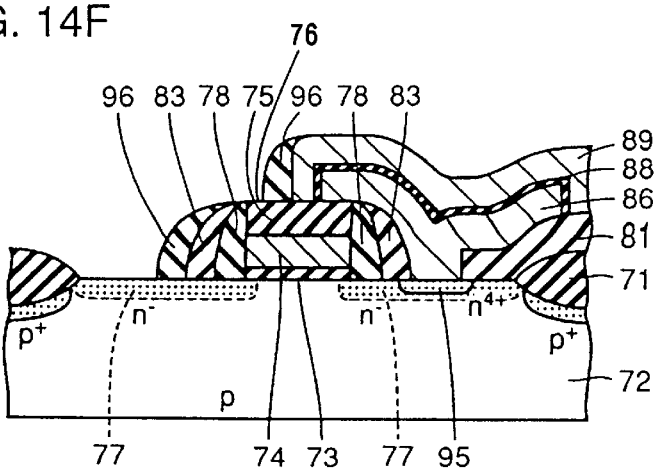

Thereafter a conductive layer 89 is formed with interposition of an insulating film 88 as shown in FIG. 14E, and then an oxide insulating film 96a of a prescribed thickness is deposited on the overall upper surface of the semiconductor substrate 72 and subjected to anisotropic etching, thereby forming a third side wall spacer 96 on the left side wall of the gate electrode FIG. 76, as shown in FIG. 14F.

Figure 14G:
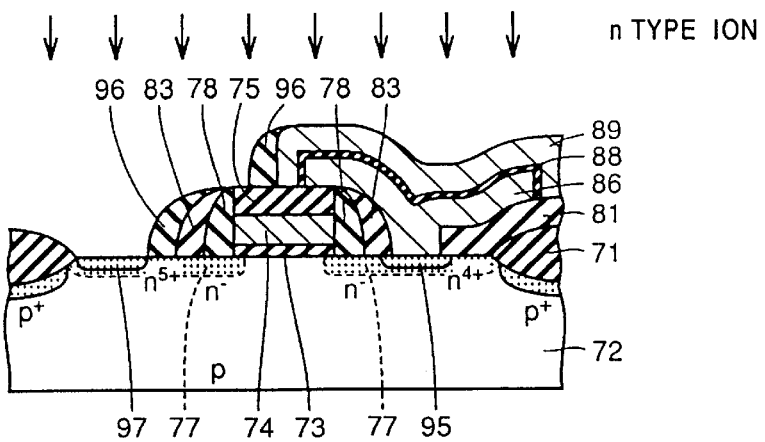

In the state shown in FIG. 14F, an n-type impurity is implanted as shown in FIG. 14G, thereby forming an $n^{5+}$ layer 97, which is substantially similar in impurity concentration to the $n^{4+}$ layer, inside an $n^-$ layer 77.

Figure 14H:
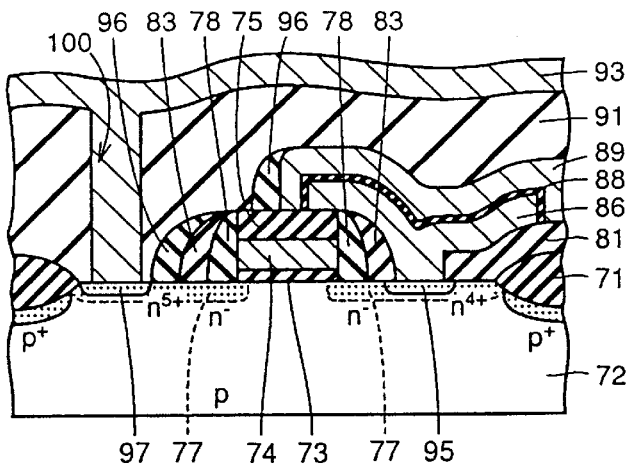

Thereafter an interlayer insulating film 91 and a polycrystalline silicon layer 93 are formed through steps similar to those shown in FIGS. 12E to 12G (FIG. 14H).

Figure 15:
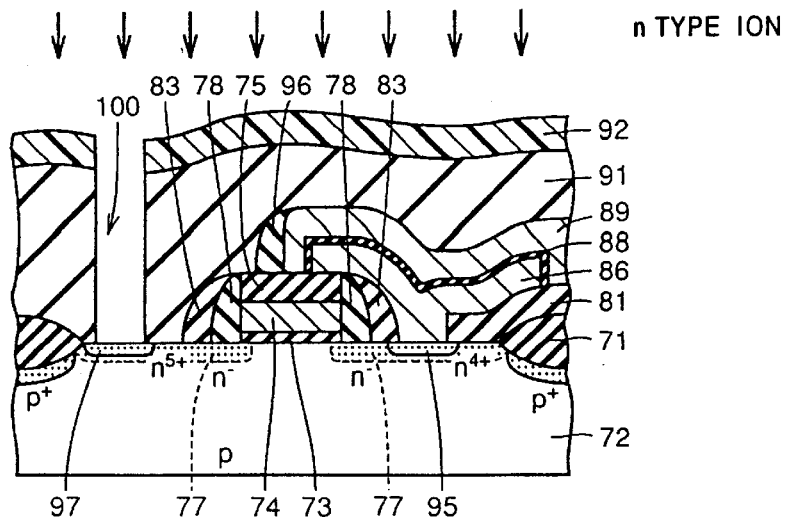
FIG. 15 is a sectional view showing a modification of a step for forming an $n^{5+}$ layer 97 in the method of manufacturing a semiconductor device according to the third embodiment of the present invention.

While the $n^{5+}$ layer 97 is formed by ion implantation through the third side wall spacer 96 serving as a mask in this embodiment, the $n^{5+}$ layer 97 can alternatively be formed by the so-called automatic doping from the polycrystalline silicon layer 93, similarly to the case of the second embodiment described with reference to FIG. 12H. In the case of forming the $n^{5+}$ layer 97 by ion implantation, the interlayer insulating film 91 and a resist film 92 may be employed as masks for ion-implanting the n-type impurity after forming a contact hole 100 in the interlayer insulating film 91 through the resist film 92 serving as a mask as shown in FIG. 15, in place of forming the $n^{5+}$ layer 97 through the mask of the side wall spacer 96 in a self-alignment manner.

While each of the aforementioned embodiments of the present invention is applied to a semiconductor device having an element isolation region which is formed by a LOCOS method, a similar functional effect can be attained also when the present invention is applied to a semiconductor device having an element isolation region which is formed by a field screening electrode, as a matter of course.

When any side wall spacer is formed by a plurality of layers in each of the aforementioned embodiments, it is difficult to identity the boundary between the respective layers by observing the section of the finished side wall spacer, so far as these layers are prepared from the same material by CVD. This is because CVD films are in amorphous states. However, a step is defined in the semiconductor substrate surface portion in the boundary between the layers by overetching of the semiconductor substrate surface in formation of the respective layers of the side wall spacer which is formed by a plurality of layers. Therefore, it is possible to determine whether or not the side wall spacer is formed by a plurality of layers by observing the section of the finished semiconductor device with an electron microscope, depending on whether or not the section has a step.

Figure 16:
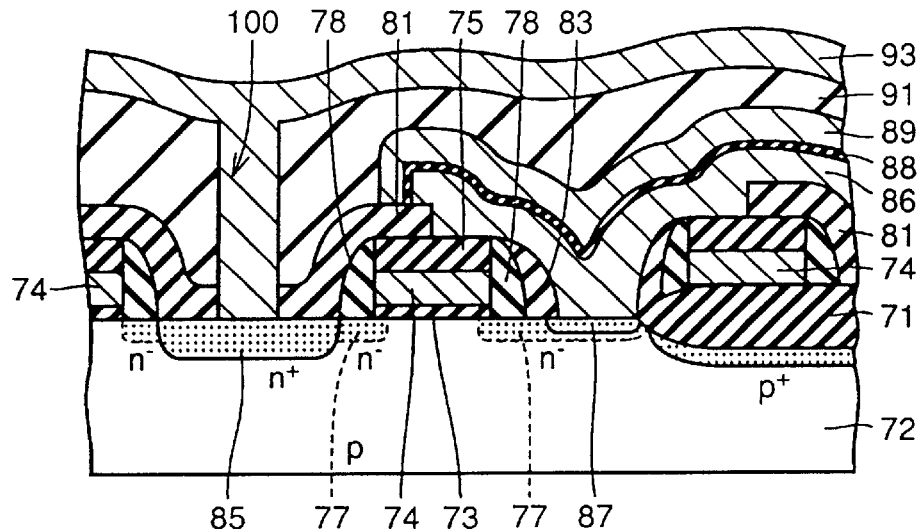
FIG. 16 is a sectional view corresponding to FIG. 12G, showing an actual device structure which can be formed through manufacturing steps similar to those of the sixth embodiment.
Figure 17:
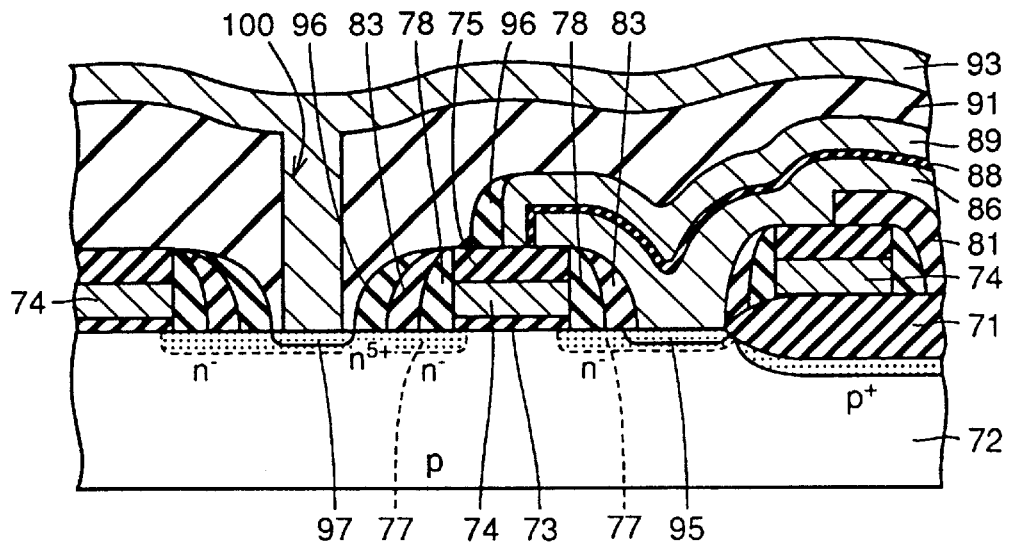
FIG. 17 is a sectional view corresponding to FIG. 14H, showing an actual device structure which can be formed through manufacturing steps similar to those of the seventh embodiment.

While each of the embodiments has been described with reference to a case of forming a single MOS field effect transistor in a single active region which is enclosed with the element isolation region 71 for simplifying the illustration, application of the present invention is not restricted to such a case, as a matter of course. For example, each of the second and third embodiments is also applicable to formation of a structure including two or more MOS field effect transistors in a single active region which is enclosed with an element isolation region 71 with a gate electrode 74 also extending on the element isolation region 71, as shown in FIG. 16 or 17 corresponding to FIG. 12G or 14H, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a field effect transistor, said field effect transistor comprising:
    a semiconductor substrate having a first conductivity type region at least in the vicinity of its surface;
    a gate electrode being formed on said semiconductor substrate with a gate insulating film interposed therebetween;

a first side wall spacer, being formed on one side wall surface of said gate electrode consisting of insulating films of a prescribed number and having a prescribed width;

a second side wall spacer, being formed on another side wall surface of said gate electrode, consisting of insulating films of a number being larger than that of said insulating films forming said first side wall spacer and having a width being larger than that of said first side wall spacer;

a pair of second conductivity type source/drain regions being formed on said surface of said semiconductor substrate between portions close to those located immediately under both side walls of said gate electrode and outer sides;

a first conductive layer doped with second conductivity type impurities and contacting one of said pair of source/drain regions located in said first side wall spacer side;

a second conductive layer doped with second conductivity type impurities, covering a surface of said second side wall spacer and contacting another one of said pair of source/drain regions located in said second side wall spacer side, wherein said pair of source/drain regions include:

a pair of low-concentration second conductivity type impurity regions being formed in the vicinity of portions immediately under both side ends of said gate electrode;

a high-concentration second conductivity type impurity region being formed only in said one of said pair of source/drain regions located in said first side wall spacer side, being connected to one of said pairs of low-concentration second conductivity type impurity regions and extending toward a side being separated from said gate electrode so that said pair of source/drain regions constitute an LDD structure asymmetric with respect to said gate electrode;

a first high-concentration second conductivity type layer contacting said first conductive layer and being formed in said high concentration second conductivity type impurity region in a self-aligned manner by the diffusion of the second conductivity type impurities from said first conductive layer;

a second high-concentration second conductivity type layer contacting said second conductive layer and being formed in said another one of said source/drain regions in said second side wall spacer side in a self-aligned manner by the diffusion of the second conductivity type impurities from said second conductive layer.

2. The semiconductor device in accordance with claim 1 further comprising:

said first side wall spacer comprises a single insulating film, said second side wall spacer comprises two layers of insulating films, one layer being identical in width to said first side wall spacer, and another insulating film layer being different in width from said first side wall spacer.

3. The semiconductor device in accordance with claim 1 further comprising:

a high-concentration second conductivity type layer being formed in said surface of said semiconductor substrate and higher in second conductivity type impurity concentration than said pair of source/drain regions, wherein said high-concentration second conductivity type layer has an end being located in the vicinity of a portion immediately under a side end portion of said second side wall spacer in said semiconductor substrate surface position and said conductive layer contacts said high-concentration second conductivity type layer.

4. The semiconductor device in accordance with claim 3 further comprising:

another high-concentration second conductivity type layer being formed in said surface of said semiconductor substrate and higher in second conductivity type impurity concentration than said pair of source/drain regions; and another conductive layer contacting said another high-concentration second conductivity type layer.

5. The semiconductor device in accordance with claim 4, wherein both of said conductive layer and said another conductive layer contain polycrystalline silicon being doped with second conductivity type impurities, both of said high-concentration second conductivity type layer and said another high-concentration second conductivity layer are formed in a self-alignment manner by thermal diffusion of second conductivity type impurity from said conductive layer and said another conductive layer respectively.

6. The semiconductor device in accordance with claim 4, wherein said gate electrode of said field effect transistor forms a word line of a memory cell of a DRAM, said conductive layer forms a storage node, and said another conductive layer forms a bit line.

* * * * *